(12) United States Patent
Fukuda et al.

(10) Patent No.: US 8,486,487 B2
(45) Date of Patent: Jul. 16, 2013

(54) GAS BARRIER FILM, GAS BARRIER FILM MANUFACTURING METHOD, RESIN SUBSTRATE FOR ORGANIC ELECTROLUMINESCENT DEVICE USING THE AFORESAID GAS BARRIER FILM, AND ORGANIC ELECTROLUMINESCENT DEVICE USING THE AFOREMENTIONED GAS BARRIER FILM

(75) Inventors: Kazuhiro Fukuda, Tokyo (JP); Chikao Mamiya, Tokyo (JP); Hiroaki Arita, Tokyo (JP)

(73) Assignee: Konica Minolta Holdings, Inc., Tokyo (JP)

( * ) Notice: Subject to any disclaimer, the term of this patent is extended or adjusted under 35 U.S.C. 154(b) by 0 days.

(21) Appl. No.: 13/213,850

(22) Filed: Aug. 19, 2011

(65) Prior Publication Data

US 2011/0300770 A1    Dec. 8, 2011

Related U.S. Application Data

(63) Continuation of application No. 11/815,812, filed as application No. PCT/JP2006/302064 on Feb. 7, 2006, now Pat. No. 8,062,707.

(30) Foreign Application Priority Data

Feb. 17, 2005  (JP) .................................. 2005-040319

(51) Int. Cl.
*C23C 16/00* (2006.01)

(52) U.S. Cl.
USPC ................. 427/255.23; 427/458; 427/255.18; 427/255.29; 427/569; 428/218

(58) Field of Classification Search
USPC ............... 313/498–512; 428/218, 451, 411.1, 428/446–447; 427/458, 533, 96.8, 248.1, 427/255.11, 255.18, 255.23, 255.29, 569, 427/58
See application file for complete search history.

(56) References Cited

U.S. PATENT DOCUMENTS

| | | | | |
|---|---|---|---|---|
| 6,429,128 B1 * | 8/2002 | Besser et al. | .................. | 438/687 |
| 6,720,660 B1 * | 4/2004 | Ushiyama | ..................... | 257/774 |
| 7,145,213 B1 * | 12/2006 | Ebel et al. | ..................... | 257/414 |
| 2003/0013280 A1 | 1/2003 | Yamanaka | | |
| 2003/0178937 A1 | 9/2003 | Mishima | | |
| 2004/0247949 A1 | 12/2004 | Akedo | | |
| 2005/0057148 A1 | 3/2005 | Seki | | |
| 2005/0079277 A1 | 4/2005 | Takashima | | |
| 2005/0285137 A1 * | 12/2005 | Satoh | ............................ | 257/178 |
| 2006/0073688 A1 | 4/2006 | Martin | | |
| 2006/0290260 A1 | 12/2006 | Choi | | |
| 2008/0254266 A1 | 10/2008 | Hachisuka | | |
| 2010/0009147 A1 | 1/2010 | Fukuda | | |
| 2011/0027966 A1 * | 2/2011 | Lee | .............................. | 438/438 |
| 2011/0100415 A1 * | 5/2011 | Osamura et al. | ............. | 136/244 |
| 2011/0215672 A1 * | 9/2011 | Yamaoka et al. | ............. | 310/300 |

FOREIGN PATENT DOCUMENTS

| | | |
|---|---|---|
| EP | 1351321 | 10/2003 |
| JP | 61297134 | 12/1986 |

(Continued)

*Primary Examiner* — Anne Hines
*Assistant Examiner* — Jose M Diaz
(74) *Attorney, Agent, or Firm* — Lucas & Mercanti, LLP

(57) ABSTRACT

A gas barrier film comprising a resin substrate provided thereon at least one layer of a ceramic film, wherein the density ratio Y (=$\rho f/\rho b$) satisfies $1 \geq Y \geq 0.95$ and the ceramic film has a residual stress being a compression stress of 0.01 MPa or more and 100 Mpa or less, wherein $\rho f$ is the density of the ceramic film and $\rho b$ is the density of a comparative ceramic film being formed by thermal oxidation or thermal nitridation of a metal as a mother material of the ceramic film so as to being the same composition ratio of the ceramic film.

10 Claims, 5 Drawing Sheets

FOREIGN PATENT DOCUMENTS

| | | |
|---|---|---|
| JP | 2001237065 | 8/2001 |
| JP | 2001315251 | 11/2001 |
| JP | 2003068447 | 3/2003 |
| JP | 2004068143 | 3/2004 |
| JP | 2004084027 | 3/2004 |
| JP | 2004158320 | 6/2004 |
| JP | 2004/107297 | 12/2004 |
| WO | 2005/108055 | 11/2005 |

\* cited by examiner

GAS BARRIER FILM, GAS BARRIER FILM MANUFACTURING METHOD, RESIN SUBSTRATE FOR ORGANIC ELECTROLUMINESCENT DEVICE USING THE AFORESAID GAS BARRIER FILM, AND ORGANIC ELECTROLUMINESCENT DEVICE USING THE AFOREMENTIONED GAS BARRIER FILM

CROSS REFERENCE TO RELATED APPLICATIONS

This application is a Continuation of U.S. application Ser. No. 11/815,812, filed Aug. 8, 2007, now U.S. Pat. No. 8,062, 707, issued Nov. 22, 2011, which was a 371 of PCT/JP2006/ 302064, filed Feb. 7, 2006, which claimed the priority of Japanese Application No. 2005-040319, filed Feb. 17, 2005, the contents of each of these applications are incorporated herein by reference.

FIELD OF THE INVENTION

The present invention relates to a gas barrier film mainly used as materials for packaging foods and pharmaceuticals, package for electronic devices, or as display materials of a plastic substance for organic electroluminescent device and liquid crystal; a method of manufacturing this gas barrier film; a resin substrate for organic electroluminescent device using this gas barrier film; and an organic electroluminescent device.

BACKGROUND

In the conventional art, a gas barrier film having a thin film of metallic oxide such as aluminum oxide, magnesium oxide and silicon oxide formed on the surface of a plastic substrate and film has been extensively used to package the products that require interception of various types of gases such as vapor and oxygen, as well as to package the foods and industrial products to prevent them from being deteriorated. In addition to packaging purposes, the gas barrier film has also been used as a substrate for a liquid crystal device, solar battery and organic electroluminescent device (hereinafter referred to as "organic EL") or the like. An aluminum foil is widely used as a packaging material in this field. However, the problem with this material is that effective method for waste disposal has not yet been found out after use, and the contents packaged in the aluminum foil cannot be identified from outside because it is basically non-transparent. Further, transparency is very important when used as a display material, and an aluminum foil completely fails to meet this requirement.

The substrate made of a polyvinylidene chloride resin or a copolymer resin made of vinylidene chloride and other polymer, or a material with gas barrier function provided by coating these vinylidene chloride-based resins on a polypropylene resin, polyester resin and polyamide resin is extensively used as a packaging material in particular. However, since chloride-related gases are produced in the process of incineration, this material is seen as creating an environmental problem. Further, its gas barrier function is not always satisfactory, and this material cannot be used in the field wherein a high degree of barrier function is essential.

The transparent substrate that is applied to the liquid crystal device and organic EL device to a greater extent. In addition to the requirements for less weight and greater size, sophisticated requirements such as long-term reliability, freedom in the shape and display on a curvature are being imposed on such a substrate. Thus, such a film substrate as a transparent plastic is coming into use, instead of a glass substrate that is vulnerable to cracks and is difficult to increase the space. For example, the Unexamined Japanese Patent Application Publication No. H2-251429 and Unexamined Japanese Patent Application Publication No. H6-124785 disclose an example of using a high molecular film as a substrate of the organic electroluminescent device.

However, the substrate such as a transparent plastic has a bas barrier function inferior to that of glass. For example, when a substrate of inferior gas barrier function is used as a substrate of the organic electroluminescent device, the organic film will be deteriorated by permeation of vapor and air, with the result that light emitting function or durability will be lost. Further, when a high molecular resin substrate is used as an electronic device substrate, oxygen will pass through the high molecular resin substrate to enter the electronic device, wherein oxygen will spread and deteriorate the device. Further, the degree of vacuum required inside the electronic device cannot be maintained.

Such problems have been left unsolved.

One of the known techniques to solve the aforementioned problems provides a method of producing a gas barrier film substrate by forming a thin film of metallic oxide on a resin film. Known gas barrier films used as a packaging material or liquid crystal display device are exemplified by the gas barrier film formed by vapor deposition of silicon oxide on a plastic film (e.g., Patent Document 1) and the film formed by vapor deposition of aluminum oxide thereon (e.g., Patent Document 2).

One of the methods for meeting the requirements for a high degree of vapor cutoff property proposed so far is the technique of producing a gas barrier film formed by alternate lamination of a compact ceramic layer and a flexible polymer layer for reducing the external impact (Patent Documents 3 and 4).

However, despite the description of the Patent Documents 3 and 4, there are problems with the adhesion between the substrate and ceramic film (layer), and stability against chronological change in particular. The barrier function is comparatively satisfactory in the initial phase but tends to be reduced in repeated thermal tests. Thus, there has been a intense demand for a gas barrier film characterized by superb flexibility and excellent barrier function.

Patent Document 1: Unexamined Japanese Patent Application Publication No. S53-12953 (Tokkosho)

Patent Document 2: Unexamined Japanese Patent Application Publication No. S58-217344 (Tokkaisho)

Patent Document 3: U.S. Pat. No. 6,268,695 (Specification)

Patent Document 4: U.S. Pat. No. 6,413,645 (Specification)

DISCLOSURE OF INVENTION

Problems to be Solved by the Invention

The object of the present invention is to provide a highly durable gas barrier film containing a compact ceramic film characterized by super adhesion with a resin film substrate and high resistance to cracks; a method of producing this gas barrier film; a resin substrate for organic electroluminescent device using this gas barrier film; and an organic electroluminescent device.

Means for Solving the Problems

According to the studies made by the present inventors, the problem with the stability of the gas barrier film characterized by the improved property of cutting off vapor and gas is found in inferior adhesion between the resin film and ceramic layer, and initial barrier function is deteriorated in a durability test such as repeated thermo tests because compressive stress is generated inside the film when the film density is increased for the purpose of enhancing the gas barrier function. Accordingly, even if this stress is reduced by a polymer film or the like, deterioration in repeated thermo test or the like cannot be reduced very much. Improvement of the barrier function can be achieved by adjusting the stress of the film as the essential component so that a very slight compression stress occurs, and by increasing the film density. This principle has been found out by the present inventors. The aforementioned object of the present invention can be achieved by the following structure.

1. In a gas barrier film having at least one layer of a ceramic film on a resin substrate, the gas barrier film characterized in that when the density of the ceramic film is $\rho f$ and the density of a comparative ceramic film formed by thermal oxidation or thermal nitridation of a metal being a mother material, of the ceramic film so as to has the same composition ratio of the ceramic film is $\rho b$, a density ratio Y of ($\rho f/\rho h$) satisfies a formula of ($1 \geq Y > 0.95$) and the ceramic film has a residual stress being a compression stress of 0.01 MPa or more and 100 Mpa or less.
2. The gas barrier film described in the above 1, characterized in that the residual stress is 0.01 MPa or more and 10 Mpa or less.
3. The gas barrier film described in the above 1 or 2, characterized in that a material constituting the ceramic film is a silicon oxide, a silicon oxide-nitride, a silicon nitride, an aluminum oxide, or a mixture thereof.
4. A resin substrate for an organic electroluminescent element characterized in that a transparent conductive thin film is formed on the gas barrier film described in any one of the above 1 to 3.
5. An organic electroluminescent element characterized in that the organic electroluminescent element is formed by coating a phosphorescence emitting organic electroluminescent material and a metal layer being a cathode on the resin substrate described in claim 4 for an organic electroluminescent element and further by sealing with adhesion of a metal foil laminated on a resin layer.
6. The organic electroluminescent element described in the above 5, characterized in that the metal foil laminated on the resin layer is laminated on the resin at a side of the metal foil where the metal foil does not come in contact with the metal layer becoming the cathode and the metal foil has ceramic layer at a side of the metal foil where the metal foil comes in contact with the metal layer becoming the cathode, wherein the density of the ceramic film is $\rho f$, and when the density of a comparative ceramic film formed by thermal oxidation or thermal nitridation of a metal being a mother material of the ceramic film so as to has the same composition ratio of the ceramic film is $\rho b$, a density ratio Y of ($\rho f/\rho h$) satisfies the formula of ($1 \geq Y > 0.95$) and the ceramic film has a residual stress being a compression stress of 0.01 MPa or more and 100 Mpa or less.
7. In a method of manufacturing a gas barrier film by exciting a gas containing a thin film forming gas with a high frequency electric: field under atmospheric pressure or a pressure close to the atmospheric pressure and exposing a resin substrate to the excited as so as to form at least one layer of a ceramic film on the resin substrate, the method characterized in that when the density of the ceramic film is $\rho f$ and the density of a comparative ceramic film formed by thermal oxidation or thermal nitridation of a metal being a mother material of the ceramic film so as to has the same composition ratio of the ceramic film is $\rho b$, a density ratio Y of ($\rho f/\rho b$) satisfies the formula of ($1 \geq Y > 0.95$) and the ceramic film has a residual stress being a compression stress of 0.01 MPa or more and 100 Mpa or less.

Effects of the Invention

The present invention provides a highly durable gas barrier film containing a compact ceramic film characterized by superb adhesion with a resin film substrate and high resistance to cracks, and a method of producing this highly durable gas barrier film, as well as a resin substrate for organic electroluminescent device, and an organic electroluminescent device by using this gas barrier film.

Figure 1:
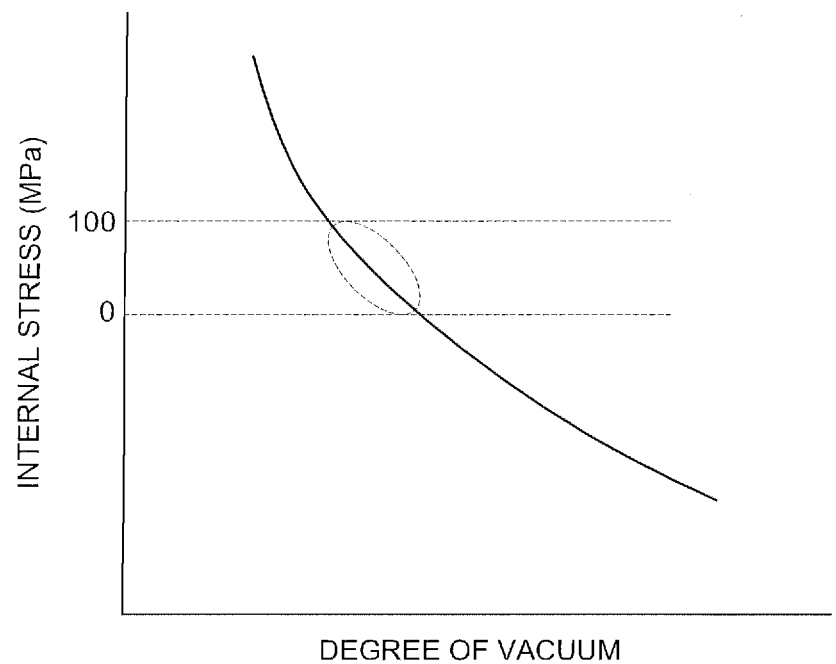
FIG. 1 is a diagram showing the relationship between the residual stress and degree of vacuum of the silicon oxide film formed by vacuum vapor deposition method.

| DESCRIPTION OF REFERENCE NUMERALS | |
| --- | --- |
| 1, 2 | Gas barrier film |
| 3 | Ceramic film |
| 3' | Polymer-containing layer |
| Y | Resin film substrate |
| 10, 30 | Plasma discharge processing apparatus |
| 11 | First electrode |
| 12 | Second electrode |
| 14 | Processing site |
| 21, 41 | First power source |
| 22, 42 | Second power source |
| 32 | Discharge space (between opposing electrodes) |
| 35 | Roll rotating electrode (first electrode) |
| 35a | Roll electrode |
| 35A | Metallic base material |
| 35B, 36B | Dielectric |
| 36 | Rectangular fixed electrode group (second electrode) |

-continued

DESCRIPTION OF REFERENCE NUMERALS

| | |
|---|---|
| 36a | Rectangular electrode |
| 36A | Metallic base material |
| 40 | Electric field application means |
| 50 | Gas supply means |
| 52 | Gas inlet |
| 53 | Exhaust outlet |
| F | Substrate |
| G | Gas |
| G° | Gas in plasma form |

BEST MODE FOR CARRYING OUT THE INVENTION

The following describes the best form of embodiment without the present invention being restricted thereto.

The gas barrier film of the present invention is an laminated film having at least one layer of ceramic film formed on a resin film. It is a resin film having a ceramic film formed in such a way that the specific density Y $(=\rho f/\rho b)$ will be $1 \geq Y > 0.95$, wherein the density of this ceramic film is $\rho f$, and the density of the ceramic film formed by thermal oxidation or thermal nitriding of the ceramic base material constituting the ceramic film having the same percentage composition as that of this ceramic film is $\rho b$. This ceramic film preferably has a residual (internal) stress of 0.01 MPa or more without exceeding 100 MPa. This arrangement provides a highly durable gas barrier film of excellent gas barrier function, having a vapor permeability of 0.1 $g/m^2/day$ or less, preferably 0.01 $g/m^2/day$ or less, and an oxygen permeability of 0.1 $ml/m^2/day$ or less, preferably 0.01 $ml/m^2/day$, as measured according to JIS K7129B.

The following describes the components constituting the gas barrier film:

The gas barrier film (layer) of the present invention will be described. There is no restriction on the composition of the gas barrier film of the present invention if it is a film that blocks passage of oxygen and vapor. The material constituting the gas barrier film of the present invention is preferably an inorganic oxide as exemplified by the ceramic film of silicon oxide, aluminum oxide, silicon oxynitride (silicon oxide-nitride), aluminum oxynitride (aluminum oxide-nitride), magnesium oxide, zinc oxide, indium oxide and tin oxide.

The optimum thickness of the gas barrier film of the present invention differs according to the type and structure of the material to be used, and is selected accordingly. The preferred thickness is 5 through 2000 nm. If this thickness of the gas barrier film is below this range, a uniform film cannot be obtained, and satisfactory gas barrier function cannot be ensured. The thickness of the gas barrier film is above this range, flexibility cannot be easily accorded to the gas barrier film. The gas barrier film may be subjected to cracks due to external factors such as bending force or tension after film formation.

In the present invention, the ceramic film as a gas barrier film formed on the resin film should be formed in such a way that the specific density Y $(=\rho f/\rho b)$ is $1 \geq Y > 0.95$, when the ceramic film formed by thermal oxidation or thermal nitriding of the base material has a density of $\rho b$, so as to get the same percentage composition as that of this ceramic film, assuming that the density thereof is $\rho f$. The specific density Y $(=\rho f/\rho b)$ is preferably $1 \geq Y > 0.98$.

In the present invention, the density of the ceramic film formed on the resin film can be obtained by the commonly known technique of analysis. In the present invention, the value obtained by X-ray reflectivity method will be used.

For the outline of the X-ray reflectivity method, reference should be made to "X-ray Diffraction Handbook", P.151 (edited by Rigaku Denki Co., Ltd., 2000, International Document Publishing Co., Ltd.) and "Chemical Industries", No. 22 January 1999.

The following describes a specific example preferably used in the present invention:

This is a method of measurement by applying X-rays to a substance having a flat surface at a very small angle, using a measuring instrument Model MXP21 manufactured by MacScience Inc. Copper is employed as a target of the X-ray source, and operation is performed at a voltage of 42 kV with an amperage of 500 mA. A multi-layer film parabolic mirror is used as an incident monochrometer. A 0.05 mm×5 mm incident slit and a 0.03 mm×20 mm light receiving slit are employed. According to the 2θ/θ scanning technique, measurement is conducted at a step width of 0.005° in the range from 0 to 5°, 10 seconds for each step by the FT method. Curve fitting is applied to the reflectivity curve having been obtained, using the Reflectivity Analysis Program Ver. 1 of MacScience Inc. Each parameter is obtained so that the residual sum of squares between the actually measured value and fitting curve will be minimized. From each parameter, the thickness and density of the lamination layer can be obtained. The film thickness of the lamination film of the present invention can also be evaluated according to the aforementioned measurement of reflectivity.

This method can be used, for example, to measure the density ($\rho f$) of the ceramic film made of silicon oxide, silicon nitride and silicon oxynitride formed by the atmospheric pressure plasma method (to be described later) or atmospheric pressure vapor deposition method.

The aforementioned ceramic film is required to be compact and is preferably kept within the aforementioned range in terms of the specific density Y $(=\rho f/\rho b)$ which is the ratio of the bulk to be the composition with respect to the density ($\rho b$) of the ceramic (silicon oxide of the bulk when the ceramic film to be formed is a silicon oxide film). This preferably provides the degree of compactness which is close to that of the bulk. The method to produce the aforementioned film stably is preferable.

The density of the ceramic film formed by thermal oxidation or thermal nitriding of the base material of the ceramic film formed by vapor deposition or plasma CVD so as to have the same percentage composition as that of the ceramic film as a gas barrier film formed on the resin film is used for the aforementioned bulk film. The base material, namely, the silicon substrate is used as the base material in the case of the silicon oxide.

Formation of the silicon oxide film by thermal oxidation of silicon substrate is widely known. A thermally oxidized film is formed on the surface of, the silicon substrate by exposure to the oxygen atmosphere, for example, at 1100° for about one hour. The property of the silicon oxide film has been much studied in the field of semiconductors. In the silicon oxide film, an approximately 1 nm-thick transitory layer having a structure different from that of the bulk silicon oxide is known to be present close to the boundary of the silicon substrate. Thus, the silicon oxide film of a sufficient thickness (100 nm or more) is formed in order to avoid adverse effect of this portion. Further, formation of a thermal nitrided film is also known. A thermal nitrided film is formed on the surface of a silicon substrate by exposure to the ammonia atmosphere, for example, at 1100° for about one hour.

The aforementioned statement also applies to the oxynitrided film and nitrided film. The ceramic film is formed from the base material, for example, a metallic substance by thermal oxynitriding or nitriding by adjusting such conditions as the type and flow rate of gas, temperature and time. The density ($\rho b$) of the bulk is measured according to the aforementioned X-ray reflectivity method.

The residual stress of the ceramic film formed on the resin film is preferably has a compressive stress of 0.01 MPa or more without exceeding 100. MPa.

For example, when the resin film having a ceramic film formed by the vapor deposition method, CVD method or sol-gel method is left to stand under predetermined conditions, a positive curl and negative curl occur due to the relationship of film quality between the substrate film and ceramic film. This curl is produced by the stress occurring in the ceramic film. The greater the amount of curl (positive), the greater will be the compressive stress.

The following method is utilized to measure the internal stress of the ceramic film. A ceramic film having the same composition and thickness as those of the film to be measured is formed on a quartz substrate having a width of 10 mm, a length of 50 mm and thickness of 0.1 mm according to the same procedure. The curl occurring to the sample having been produced is measured by a thin film evaluation device, Model MH4000 manufactured by NEC Sanei Co., Ltd., with the concave portion of the sample facing upward. Generally, the stress is said to be positive when the positive curl wherein the film side is contracted with respect to the substrate by the compressive stress. Conversely, when a negative curl is produced by the tensile stress, the stress is said to be negative.

In the present invention, the stress value is preferably 200 MPa or less in the positive range, more preferably 0.01 MPa or more without exceeding 100 MPa, still more preferably 0.01 MPa or more without exceeding 10 MPa.

The residual stress of the resin film with the silicon oxide film formed thereon can be regulated by adjusting the degree of vacuum, for example, when the silicon oxide film is formed by vapor deposition method. FIG. 1 shows the relationship between the degree of vacuum in the chamber when a 1 μm-thick silicon oxide film is formed on a quartz substrate having a width of 10 mm, a length of 50 mm and thickness of 0.1 mm according to the same procedure by vapor deposition, and the residual (internal) stress of the formed silicon oxide film measured by the aforementioned method. In FIG. 1, a laminated film having a residual stress greater than 0 without exceeding about 100 MPa is preferred. However, intricate control is difficult in fine adjustment and adjustment cannot be made within this range in many cases. If the stress is too small, partial tensile stress sometimes occurs, the film will be less durable, and will be subjected to cracks and fracture. If the stress is excessive, the film tends to be broken.

In the present invention, there is no particular restriction to the method of manufacturing a ceramic film as a gas barrier film. For example, the ceramic film can be made by the wet type method based of the sol-gel technique. However, satisfactory smoothness on the molecular level (on the order of "nm") cannot be easily obtained by the wet method such as the spray method or spin coating method. Since a solvent is used, and the substrate (to be described later) is made of an organic material, there is a restriction on the type of the substrate or solvent to be used. Thus, in the present invention, the ceramic film is preferably formed by the sputtering method, ion assist method, plasma CVD method (to be described later), or plasma CVD method under atmospheric pressure or under the pressure close thereto (to be described later). Especially the plasma CVD method under atmospheric pressure eliminates the need of using a pressure reducing chamber and provides a high-speed and highly productive film making procedure. When the gas barrier film is produced by the plasma CVD method, a film characterized by a uniform and smooth surface and very small internal stress (0.01 through 100 MPa) can be produced with comparative ease.

To improve specific density ratio in the plasma method under atmospheric pressure, it is preferred to increase the output of high-frequency power. Especially, the film production speed in the discharge space is preferably reduced below 10 nm/sec., and the output density is preferably 10 W/cm$^2$ or more, more preferably 15 W/cm$^2$ or more.

To perform the function of the gas barrier film, the thickness of the ceramic film is preferably 5 through 2000 nm.

If the thickness is less than that, much film defect will occur and a sufficient moisture resistance cannot be ensured. Theoretically, a greater thickness provides a greater moisture resistance, but if thickness is excessive, internal stress will be increased too much and cracks will occur, with the result that excellent moisture resistance cannot be provided.

In the present invention, the ceramic film to be made into the aforementioned gas barrier layer is preferably transparent, because the transparent gas barrier layer makes it possible to get a transparent gas barrier film, which can be used as a transparent substrate for an EL device. The light transmittance of the gas barrier film is preferably 80% or more, more preferably 90% or more, for example, when the wavelength of the test light is 550 nm.

The gas barrier layer obtained by the plasma CVD method, the plasma CVD method under atmospheric pressure or the plasma CVD method or under the pressure close thereto allows production of a ceramic film of metallic carbide, metallic nitride, metallic oxide, metallic sulfide and others, and the mixture thereof (metallic nitride and metallic carbide nitride) to be formed as desired, by selecting such conditions as the type of organic metallic compound as the raw material (also called the material), cracked gas, decomposition temperature and input power.

For example, if the silicon compound is used as a material compound and oxygen is used as a cracked gas, a silicon oxide can be produced. When a zinc compound is used as a material and carbon disulfide is used as a cracked gas, zinc sulfide is produced. This is because multi-phase chemical reaction is promoted at a very high speed in a plasma space due to high-density presence of very active charged particle and active radical in a plasma space, and the element present in the plasma space is converted into a thermodynamically stable compound in a very short period of time.

The inorganic material can be a gas, liquid or solid at the normal temperature and normal pressure if it contains a typical or transitional metal element. In the case of a gas, the material can be introduced into a discharge space directly, but in the case of a liquid or solid, the material is gasified by heating, bubbling, depressurization or ultrasonic irradiation. Alternatively, it can be used after being diluted by solvent or others. In this case, the solvent is exemplified by an organic solvent such as methanol, ethanol and n-hexane, or the mixture thereof. These dilution solvent is decomposed into molecules and atoms in the process of plasma discharge, and its influence can be almost ignored.

The aforementioned organic metallic compound is exemplified by such a silicon compound as silane, tetramethoxy silane, tetraethoxy silane (TEOS), tetra-n-proxy silane, tetraisoproxy silane, tetra-n-butoxy silane, tetra-t buthoxy silane, dimethyl dimethoxy silane, dimethyl diethoxy silaue, diethyl dimethoxy silane, diphenyl di-methoxy silane, methyl triethoxy silane, ethyl triethoxy silane, phenyl triethoxy silane, (3,3,3-trifluoropropyl)triethoxy silane, hexamethyl disiloxane, bis(dimethylamino)dimethyl silane, bis((dimethyl amino)methyl vinyl silane, bis(ethylamino)dimethyl silane, N,O-bis(trimethyl silyl)acetoamide, bis(trimethyl silyl)carbodiimide, diethylamino trimethyl silane, dimethylaminodimethyl silane, hexamethyl disilazane, hexamethyl cyclo trisilazane, heptamethyl disilazane, nonamethyl trisilazane, octamethylcyclo tetrasilazane, tetrakis dimethylamino silane, tetraisocyanate silane, tetramethyl disilane, tris(dimethylamino) silane, triethoxy fluoro silane, alyldimethyl silane, alyltrimethyl silane, benzyltrimethyl silane, bis(trimethylsilyl)acetylene, 1,4-bistrimethylsilyl-1,3-butadiene, di-t-buryl silane, 1,3-disilabutane, bis(trimethylsilyl)methane, cyclopentadienyl trimethyl silane, phenyldimethyl silane, phenyltrimethyl silane, propargyl trimethyl silane, tetramethyl silane, trimethylsilyl acetylene, 1-(trimethyl silyl)-1-propyne, tris(trimethylsilyl)methane, tris(trimethylsilyl)silane, vinyl trimethyl silane, hexamethyl disilane, octamethyl cyclotetrasiloxane, tetramethyl cyclotetrasiloxane, hexamethyl cyclotetrasiloxane, and M silicate 51.

The titanium compound is exemplified by titanium methoxide, titanium ethoxide, titanium isopropoxide, titanium tetraisopropoxide, titanium n-butoxide, titanium diisopropoxide(bis-2,4-pentane dionate), titanium diisopropoxide (bis-2,4-ethylaceto acetate), titanium di-n-butoxide(bis-2,4-pentanedionate), titanium acetylacetonate, and butyltitanate dimer.

The zirconium compound is exampled by zirconium n-propoxide, zirconium n-butoxide, zirconium t-butoxide, zirconium tri-n-butoxide acetyl acetonate, zirconium di-n-butoxide bisacetyl acetonate, zirconium acetyl acetonate, zirconium acetate, and zirconium hexafluoropentanedionate.

The aluminum compound is exemplified by aluminum ethoxide, aluminum triisopropoxide, aluminum isopropoxide, aluminum n-butoxide, aluminum s-butoxide, aluminum t-butoxide, aluminum acetylacetonate, and triethyl dialuminum tri-s-butoxide.

The boron compound is exemplified by diborane, tetraborane, boron fluoride, boron chloride, boron bromide, boron diethyl ether complex, boron-THF complex, boron-dimethyl sulfoide complex, boron diethyl ether trifluoride complex, triethyl boron, trimethoxy boron, triethoxy boron, tri(isopropoxy)boron, borazole, trimethyl borazole, triethyl borazole, and triisopropyl borazole.

The tin compound is exemplified by tetraethyl tin, tetramethyl tin, di-n-butyl tin diacetate, tetrabutyl tin, tetraoctyl tin, tetraethoxy tin, methyltriethoxy tin, diethyl diethoxy tin, triisopropyl ethoxy tin, diethyl tin, dimethyl tin, diisopropyl tin, dibutyl tin, diethoxy tin, dimethoxy tin, diisopropoxy tin, dibutoxy tin, tin dibutylate, tin diacetoacetonate, ethyl tin acetoacetonate, ethoxy tin acetoacetonate, dimethyl tin acetoacetonate, as well as tin hydrogen compound. The halogenated tin is exemplified by tin dichloride and tin tetrachloride.

The other organic compound is exemplified by antimony ethoxide, arsenic triethoxide, barium 2,2,6,6-tetramethyl heptanedionate, beryllium acetylacetonate, bismuth hexafluoro pentane dionate, dimethyl cadmium, calcium 2,2,6,6-tetramethyl heptanedionate, chromium trifluoro pentanedionate, cobalt acetylacetonate, copper hexafluoro pentanedionate, magnesium hexafluoro pentanedionate-dimethyl ether complex, gallium ethoxide, tetraethoxy germane, tetramethoxy germane, hafnium t-butoxide, hafnium ethoxide, indium acetyl acetonate, indium 2,6-dimethyl aminoheptanedionate, ferrocene, lanthanum isopropoxide, lead acetate, lead tetraethyl, neodymium acetyl acetonate, platinum hexafluoro pentanedionate, trimethyl cyclopentadienyl platinum, rhodium dicarbonyl acetyl acetonate, strontium 2,2,6,6-tetramethyl heptanedionate, tantalum methoxide, tantalumtrifluoro ethoxide, tellurium ethoxide, tungsten ethoxide, vanadium triisopropoxide oxide, magnesium hexafluoro acetyl acetonate, zinc acetyl acetonate, and diethyl zinc.

The cracked gas to get the inorganic compound by decomposing the material gas including these metals is exemplified by hydrogen gas, methane gas, acetylene gas, carbon monoxide, carbon dioxide, nitrogen gas, ammonium gas, nitrous oxide gas, nitrogen oxide gas, nitrogen dioxide gas, oxygen gas, vapor, fluorine gas, hydrogen fluoride, trifluoro alcohol, trifluoro toluene, hydrogen sulfide, sulfur dioxide, carbon disulfide, and chlorine gas.

Various types of metallic carbides, metallic nitrides, metallic oxides, metallic halides and metallic sulfides can be obtained by proper selection of the material gas including a metallic element and cracked gas.

A discharge gas easily converted into a plasma is added to these reaction gases, and is fed into a plasma discharge generator.

Such a discharge gas used includes a nitrogen gas and/or Group XVIII element of the Periodic Table exemplified by helium, neon, argon, krypton, xenon and radon. Of these elements, nitrogen, helium, and argon are preferably used in particular. Nitrogen is more preferably because of low costs.

The aforementioned discharge gas and reaction gas are mixed to form a gas mixture, which is supplied to plasma discharge generation apparatus (plasma generation apparatus) and form a film. The mixture ratio between the discharge gas and reaction gas depends on the properties of the film to be obtained, but the percentage of the discharge gas relative to the entire gas mixture is preferably 50% by volume or more when a reaction gas is supplied.

In the ceramic film used as a gas barrier film of the present invention, the inorganic compound contained in the ceramic film is preferably $SiO_xC_y$ (x=1.5 to 2.0, y=0 to 0.5) or $SiO_xSiN_y$ or $SiO_xN_y$ (x=1 to 2, y=0.1 to 1). Especially, $SiO_x$ is preferred from the viewpoint of gas barrier function, moisture permeability, light transmittance, and suitability to plasma CVD under atmospheric pressure. That the ceramic film formed by the thermal oxidation or thermal nitriding for giving $\rho b$ to be used for reference has "the same percentage composition" as that of the ceramic film of the present invention signifies that the atomic percentage compositions are the same.

In the inorganic compound included in the ceramic film of the present invention, for example, the film containing at least one of the oxygen and nitrogen gas, and silicon atom can be obtained by combining the oxygen gas and nitrogen gas with the aforementioned silicon compound at a predetermined ratio.

As described above, various forms of inorganic thin films can be formed by using the aforementioned material gas together with the discharge gas.

The following describes the resin film substrate used in the gas barrier film of the present invention.

There is no particular restriction to the film if it is made of the organic material capable of holding the gas barrier layer having the aforementioned barrier function.

It is exemplified by a polyolefin (PO) resin including a single polymer such as ethylene, polypropylene and butene or the copolymer thereof, an amorphous polyolefin (APO) resin such as cyclic polyolefin, a polyester based resin such as polyethylene terephthalate (PET), polyethylene 2,6-naphthalate (PEN) and terephthalate (PET), a polyamide (PA) resin such as nylon 6, nylon 12 and copolymer nylon, a polyvinyl alcohol (PVA) resin, a polyvinyl alcohol resin such as ethylene vinyl alcohol copolymer (EVOH), a polyimide (PI) resin, a polyether imide (PET) resin, a polysulfone (PS) resin, a polyether sulfone (PES) resin, a polyether ether ketone (PEEK) resin, a polycarbonate (PC) resin, a polyvinyl butylate (PVB) resin, a polyarylate (PAR) resin, and a fluorine base resin such as ethylene-ethylene tetrafluoride copolymer (ETFE), ethylene trifluoride chloride (PFA), ethylene tetrafluoride-perfluoroalkyl vinyl ether copolymer (FEF), vinylidene fluoride (PVDF), vinyl fluoride (PVE) and perfluoro ethylene-per-fluoro propylene-per-fluoro vinyl ether copolymer (EPA).

In addition to the aforementioned resin, it is possible to use a resin composition made up of the acrylate compound containing a radial reactive unsaturated compound; a resin compound made up of the aforementioned acrylate compound and a mercapto compound containing a thiol group; a photocurable resin such as a resin composition which is produced by dissolving the oligomer such as epoxy acrylate, urethane acrylate, polyester acrylate and polyether acrylate into polyfunctional acrylate monomer; and the mixture thereof. Further, one or more of these resins laminated by means of lamination and coating can be used as a resin film substrate.

These materials can be used independently or in combination. The commercially available product such as Zeronex and Zeonea (by Nippon Zeon Co., Ltd.), ARTON (J.S.R. Inc.) of amorphous cyclopolyolefin resin film, Pure Ace (by Teijin Limited) of polycarbonate film, and Konica Minolta TAC KC4UX and KC8UX (Konica Minolta Opto Inc.) of cellulose triacetate film can be preferable utilized.

Further, the resin film substrate is preferably transparent. When the substrate is transparent and the layer formed on the substrate is also transparent, a transparent gas barrier film can be produced. A transparent substrate such as a organic EL device can also be manufactured.

The resin film substrate using the aforementioned resin can be an unoriented film or an oriented film.

The resin film substrate used in the present invention can be manufactured by the commonly known method. For example, the resin as a material is molten by an extruder and is extruded through an annular dies or T-dies to be quenched immediately thereafter. This procedure yields a virtually amorphous and unoriented substrate. Further, the unoriented substrate is oriented in the flow direction of the substrate (vertical axis) or in the direction perpendicular to the flow of the substrate (horizontal axis) by the known method of uniaxial orientation, tenter based sequential biaxial orientation, tenter based simultaneous biaxial orientation or tubular simultaneous biaxial orientation, whereby an oriented substrate is produced. The draw magnification in this case can be selected properly in conformity to the resin as a material of the substrate, and is preferred 2 to 10 times in the vertical and horizontal directions.

Prior to the step of vapor deposition, the resin film substrate of the present invention may be subjected to surface treatment such as corona processing, flame processing, plasma processing, glow discharge processing, surface roughing, or chemical treatment.

To enhance adhesion with the vapor deposited film, a layer of anchor coating agent can be formed on the surface of the resin film substrate of the present invention. The anchor coating agent used for this anchor coating agent layer can be formed by one or more of polyester resin, isocyanate resin, urethane resin, acryl resin, ethylene vinyl alcohol resin, vinyl denatured resin, epoxy resin, denatured styrene resin, denatured silicon resin, and alkyl titanate. The conventionally used additives can be added to these anchor coating agents. The anchor coating agents can be coated according to the conventional method of roll coating, gravure coating, knife coating, dip coating or spray coating, and the solvent and dilutant are removed by drying, whereby anchor coating is provided. The preferred amount of the anchor coating agent is 0.1 through 5 g/m$^2$ (when dry).

The resin film substrate is preferably a long film wound in a roll. The thickness of the film substrate differs according to the usage of the gas barrier film to be obtained, and cannot be determined simply. When the gas barrier film is used for packaging, there is no particular restriction to the thickness. From the viewpoint of adaptability to packaging purposes, the thickness is preferably 3 through 400 µm, more preferably 6 through 30 µm.

The resin film substrate used in the present invention has a film thickness of preferably 10 through 200 µm, more preferably 50 through 100 µm.

When the gas barrier film of the present invention is used for the application that requires a high degree of vapor barrier function as in the organic EL display or high-definition color liquid crystal display, the vapor transmittance is preferred not to exceed 0.001 g/m$^2$/day as measured according to JIS K7129B. When this film used for the organic EL display, a dark spot that grows may occur although the dark spot is very small. This may drastically reduce the service life of the display. Accordingly, the vapor transmittance is preferably below $1\times10^{-5}$ g/m$^2$/day.

With respect to the method of manufacturing a gas barrier film of the present invention, the following describes the further details of the plasma CVD method and the plasma CVD method under atmospheric pressure which are preferably employed to form a gas barrier film or ceramic film:

The following describes the plasma CVD method:

In the plasma CVD method (chemical vapor deposition), a volatilized and sublimed organic metallic compound is deposited on the surface of the high-temperature substrate and thermal decomposition occurs, whereby a thin film of thermally stable inorganic substance is formed. In this normal CVD method (also called thermal CVD method), the substrate temperature is required to reach 500° C. or more. Thus, this method cannot be easily used for the production of a film for a plastic substrate.

On the other hand, in the plasma CVD method, electric field is applied to the space in the vicinity of the substrate, and a space (plasma space) is created wherein the gas is present in the form of plasma. The volatilized and sublimed organic metallic compound is led into this plasma space, and decomposition occurs. After that, the compound is sprayed onto the substrate, then an inorganic thin film is formed thereon. In the plasma space, a high percentage of gas (as high as several percent) is ionized into iron and electron. Although gas temperature is kept low, the organic metallic compound as the material of the inorganic film can be decomposed at a low temperature because of very high electron temperature and contact with the gas in the excited state such as an ion radical despite a low temperature. Thus, the temperature of the substrate for manufacturing the inorganic substance can be reduced, and a film is manufactured on the resin film substrate by this plasma CVD method.

However, the plasma CVD method requires electric field to be applied to the gas to cause ionization so that gas is converted into plasma. Normally, a film is manufactured in the space of reduced pressure ranging from 0.100 kPa through 10.1 kPa. This requires an increased size of the equipment and a complicated operation procedure when manufacturing a large-area film. Thus, this method involves a productivity problem.

As compared with the plasma CVD method under vacuum, the plasma CVD method under the pressure close to the atmospheric pressure does not require reduction of pressure, and is characterized by higher productivity. Not only that, since the plasma density is high, the film making speed is high. As compared with the normal conditions of the plasma CVD method, the average free process of gas is very short under the high-pressure conditions of the atmospheric pressure. This provides a very flat film which is characterized by excellent optical properties and excellent gas barrier function. For this reason, the plasma CVD method under atmospheric pressure is preferably used in the present invention as compared to the plasma CVD method under vacuum.

When the aforementioned ceramic film is formed on the resin film, this method ensures the film density and produces a thin film characterized by superb stable performances. This method also provides stable production of a ceramic film having a residual stress of 0.01 MPa or more without exceeding 100 MPa in terms of compressive stress.

Figure 2:
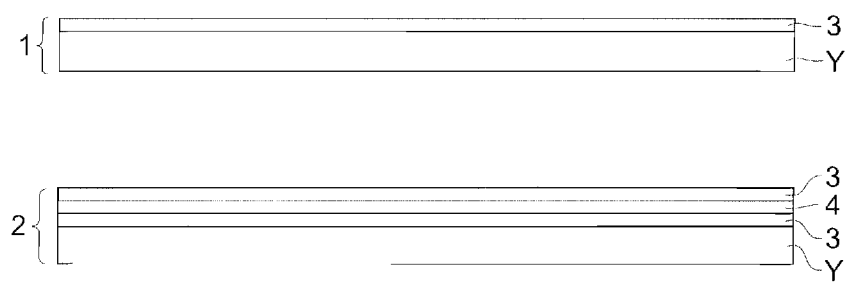
FIG. 2 is a schematic diagram showing the layer structure of the gas barrier film of the present invention.

FIG. 2 is a schematic diagram showing the layer structure of a transparent gas barrier film.

The gas barrier film 1 has a layer of ceramic film 3 on a resin film substrate Y, e.g., polyethylene terephthalate. The gas barrier film 2 includes a resin film substrate B, at least two layers of ceramic films 3, and a layer 3' containing a polymer more flexible than the ceramic film located between two ceramic films. The polymer layer used in this case is made of the material used in the resin film as the substrate of the gas barrier film, and the material is exemplified by;

a polyolefin (PO) resin made of an independent polymer or copolymer of ethylene, polypropylene and butene;

an amorphous polyolefin (APO) of cyclic polyolefin; and a resin of polyethylene terephthalate and others.

There is no particular restriction if it is a film made of an organic material capable of retaining the gas barrier layer.

In the gas barrier film 2, the ceramic films 3 and the layers 3' containing the polymer are shown to be alternately laminated. There is no particular restriction to their order or number in their layout if only a layer containing the polymer is sandwiched between the inorganic layers.

The ceramic film of the present invention is characterized by a compact structure and a high degree of hardness. It is preferably divided into a plurality of layers and is laminated through a stress reducing layer. To protect the surface, a protective layer can be provided. The stress reducing layer reduces the stress occurring to the ceramic layer and prevents cracks and other defects from occurring to the inorganic ceramic film.

An adhesive layer to enhance adhesion with the resin film substrate instead of the polymer layer, a stress reducing layer or a protective layer can be made of the same ceramic materials. A ceramic film having excellent adhesion with the resin film substrate or a less hard ceramic film resistant to cracks and damage can be obtained by selecting the ceramic film forming conditions (reaction gas, electric power and high-frequency power source) and changing the percentage of carbon content, for example.

The aforementioned gas barrier films of the present invention can be used as various forms of sealing materials and films.

The aforementioned gas barrier film of the present invention can be preferably used in the display element, for example, organic EL device. When used in the organic EL device, the gas barrier film of the present invention can be used as a substrate to take in light through this film since the gas barrier film is transparent. To be more specific, a transparent conductive thin film such as ITO is provided as a transparent electrode on this gas barrier film, and a resin substrate for organic electroluminescent device is manufactured. Then an organic EL material layer including the light emitting layer is provided on the ITO transparent conductive film on the substrate used as an anode, and a cathode made up of a metallic film is formed, whereby an organic EL device is formed. Another sealing material (or the same one) is placed on this organic EL device, and the gas barrier film substrate is bonded the surrounding area so as to enclose and seal the device. Thus, the organic EL device layer can be sealed. This arrangement protects against adverse effect of the external moisture or gases such as oxygen upon the device.

The transparent conductive film can be formed by the vacuum vapor deposition method or sputtering method, as well as by the coating method including a sol-gel method using the metallic alkoxide such as indium or tin. Such a method will provide an ITO film characterized by excellent conductivity on the level of a specific resistance value of $10^{-4}$ Ω·cm. This film is preferably manufactured according to the plasma CVD method using an organic metallic compound as exemplified by the metallic alkoxide such as indium or tin or alkyl metal, in the same manner as above. This will be discussed later.

The details of the organic EL device layer will also be described later. The device having a light emitting layer of phosphorescent type containing the phosphorescent dopant on the light emitting layer exhibits excellent light emission efficiency as an organic EL device in the present invention, and is preferably used.

The following describes the method of manufacturing the gas barrier film using the plasma CVD method under atmospheric pressure or under the pressure close thereto.

Referring to FIGS. 3 through 6, the following describes an example of the plasma film manufacturing apparatus used in the production of the gas barrier film in the present invention. In the drawing, symbol F denotes a longer film as an example of the substrate.

Figure 3:
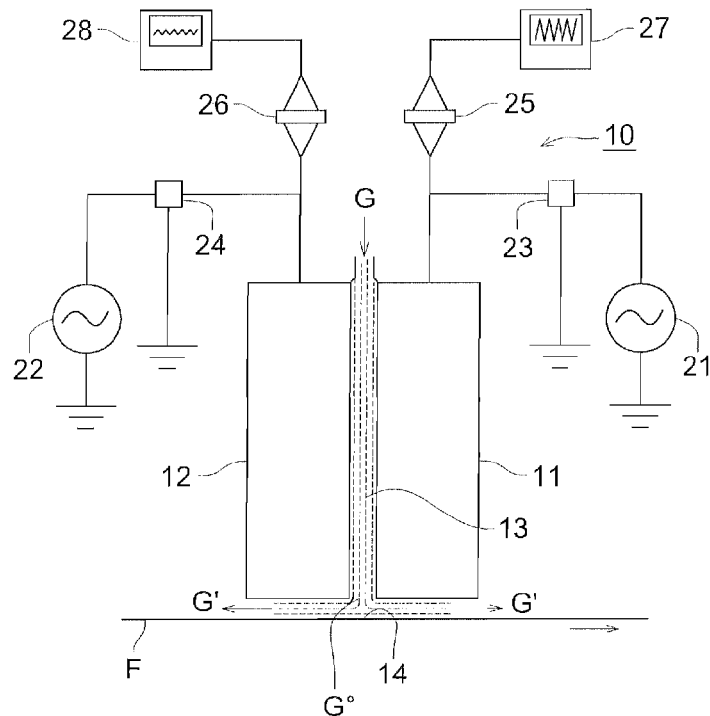
FIG. 3 is a schematic view showing an example of the jet type atmospheric pressure plasma discharge processing apparatus preferably used in the present invention.
Figure 4:
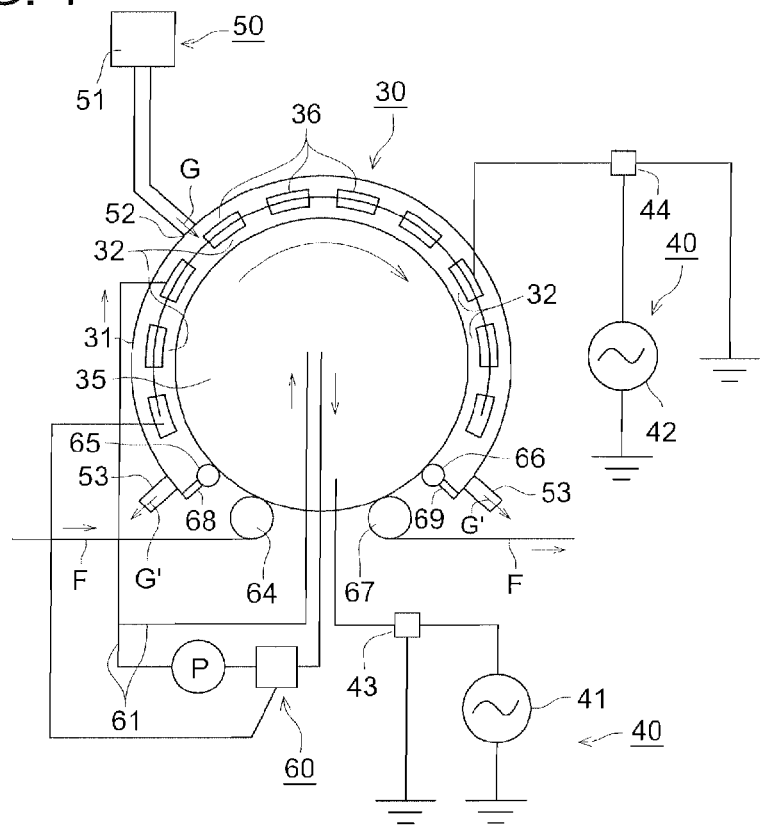
FIG. 4 is a schematic view showing an example of the atmospheric pressure plasma discharge processing apparatus for processing a substrate between the opposing electrodes, preferably used in the present invention.

In the plasma discharge processing apparatus shown in FIGS. 3 and 4, the material gas including the aforementioned metal and the cracked gas are properly selected from a gas supply unit. The discharge gas easily convertible into plasma is mixed with these reaction gases, and the gas is fed into the plasma discharge generation apparatus, whereby the aforementioned ceramic film can be produced.

As described above, such a discharge gas includes a nitrogen gas and/or Group XVIII element of the Periodic Table exemplified by helium, neon, argon, krypton, xenon and radon. Of these elements, nitrogen, helium, and argon are preferably used in particular. Nitrogen is more preferably because of low costs.

FIG. 3 shows an atmospheric plasma discharge processing apparatus. It contains a gas supply unit and electrode temperature regulating unit (not illustrated in FIG. 3, but shown in FIG. 4), in addition to the atmospheric plasma discharge processing apparatus and an electric field application unit having two power sources.

The plasma discharge processing apparatus 10 has the opposing electrodes formed of a first electrode 11 and second electrode 12. From the first electrode 11, the first high-frequency electric field of frequency ω1, electric field intensity $V_1$ and current $I_1$ from the first power source 21 is applied between the opposing electrodes. From the second electrode 12, the second high-frequency electric field of frequency ω2, electric field intensity $V_2$ and current $I_2$ from the second power source 22 is applied between the opposing electrodes.

The first power source 21 can apply high frequency field intensity ($V_1 > V_2$) higher than that of the second power source 22. Further, the frequency $\omega 1$ of the first power source 21 can apply the frequency lower than the second frequency $\omega 2$ of the second power source 22.

The first filter 23 is installed between the first electrode 11 and first power source 21, and is intended to facilitate the flow of current from the first power source 21 to the first electrode 11. The current from the second power source 22 is grounded so as to hinder the flow of current from the second power source 22 to the first power source 21.

The second filter 24 is installed between the second electrode 12 and second power source 22, and is intended to facilitate the flow of current from the second power source 22 to the second electrode. The current from the first power source 21 is grounded so as to hinder the flow of current from the first power source 21 to the second power source 21.

Gas G is fed between the opposing electrodes of the first electrode 11 and second electrode 12 (discharge space) from the gas supply unit as shown in FIG. 4 (to be described later), and high frequency electric field is applied from the first electrode 11 and second electrode 12 to cause discharge processing. The gas G made in the state of plasma is sprayed and jetted to the lower side of the opposing electrodes (to the bottom side of paper surface), so that the processing space formed by the bottom surface of the opposing electrodes and the substrate F is filled with the gas G in the state of plasma. Close to the processing position 14, a thin film is formed on the substrate F unwound and fed from the unwinder of the substrate (not illustrated) or the substrate F fed from the preceding process. During the formation of the thin film, the electrode is heated or cooled by a medium coming from the electrode temperature regulating unit as shown in the FIG. 4 (to be described later) through the tube. Depending on the temperature of the substrate during the plasma discharge, the physical properties and composition of the thin film to be obtained may vary. This is preferably provided with adequate control. Such an insulating material as distilled water or oil is preferably used as the medium for temperature regulation. At the time of plasma discharge processing, the temperature inside the electrode is preferably regulated to ensure uniform temperature in order to minimize uneven temperature of the substrate both across the width and along the length.

A plurality of jet type atmospheric pressure plasma discharge processing apparatuses are arranged in contact with each other in series, and the gas in the same state of plasma can be discharged simultaneously. This allows repeated high-speed processing operations. A laminated thin film having different layers can be formed when gases in a different state of plasma are jetted from these apparatuses.

FIG. 4 is a schematic diagram showing an example of the atmospheric pressure plasma discharge processing apparatuses wherein a substance is processed between the opposing electrodes preferably used in the present invention.

The atmospheric pressure plasma discharge processing apparatuses of the present invention includes at least a plasma discharge processing apparatus 30, an electric field applying unit 40 having two power sources, a gas supply unit 50 and an electrode temperature regulating unit 60.

FIG. 4 shows that a thin film is formed by plasma discharge processing of a substrate F, using the opposing electrodes (discharge processing space) 32 of a roll rotating electrode (first electrode) 35 and a rectangular stationary electrode group (second electrode) 36.

For the opposing electrodes (discharge processing space) 32 of a roll rotating electrode (first electrode) 35 and a rectangular stationary electrode group (second electrode) 36, the first high frequency electric field of frequency $\omega 1$, electric field intensity $V_1$ and current $I_1$ is applied from the first power source 41 to the roll rotating electrode (first electrode) 35, while the second high frequency electric field of frequency $\omega 2$, electric field intensity $V_2$ and current $I_2$ is applied from the second power source 42 to the rectangular stationary electrode group (second electrode) 36.

The first filter 43 is installed between the roll rotating electrode (first electrode) 35 and first power source 41, and is intended to facilitate the flow of current from the first power source 41 to the first electrode. The current from the second power source 42 is grounded so as to hinder the flow of current from the second power source 42 to the first power source. The second filter 44 is installed between the rectangular stationary electrode group (second electrode) 36 and second power source 42, and is intended to facilitate the flow of current from the second power source 42 to the second electrode. The current from the first power source 41 is grounded so as to hinder the flow of current from the first power source 41 to the second power source.

In the present invention, the roll rotating electrode 35 can be used as the second electrode, and the rectangular stationary electrode group 36 as the first electrode. The first power source is connected to the first electrode, and the second power source is connected to the second electrode. The high frequency electric field higher than that of the second power source ($V_1 > V_2$) is preferably applied to the first power source. Further, the frequency has the capacity represented by $f1 < \omega 2$.

The current is preferably $I_1 < I_2$. The current $I_1$ of the first high frequency electric field is preferably 0.3 mA/cm$^2$ through 20 mA/cm$^2$, more preferably 1.0 mA/cm$^2$ through 20 mA/cm$^2$. The current $I_2$ of the second high frequency electric field is preferably 10 mA/cm$^2$ through 100 mA/cm$^2$, more preferably 20 mA/cm$^2$ through 100 mA/cm$^2$.

After the flow rate has been controlled, the gas G generated from the gas generating apparatus 51 of the gas supply unit 50 is fed to a plasma discharge processing container 31 from the gas inlet 52.

The substrate F is unwound and fed from the unwinder of the substrate (not illustrated) or is fed from the preceding process. It passes through the guide roll 64, and the air entrained by the substrate is cut off by the nip roll 65. The substrate F is wound and rotated while being kept in contact with the roll rotating electrode 35, and is conveyed to the position between roll rotating electrode 35 and the rectangular stationary electrode group 36. Electric field is applied from both the roll rotating electrode (first electrode) 35 and the rectangular stationary electrode group (second electrode) 36, and discharged plasma is generated by the opposing electrodes (discharge processing space) 32. The substrate F is wound and rotated in contact with the roll rotating electrode 35 and a thin film is formed by the gas in the state of plasma. Having passed through the nip roll 66 and guide roll 67, the substrate F is wound by a winder (not illustrated) or is fed to the next process.

The processed exhaust gas G' having been discharged is ejected from an exhaust outlet 53.

To heat or cool the roll rotating electrode (first electrode) 35 and rectangular stationary electrode group (second electrode) 36 during the formation of a thin film, the medium whose temperature has been regulated by the electrode temperature regulating unit 60 is sent to both electrodes by a pump P through a tube 61 so that the temperature is regulated from inside the electrodes. The reference numerals 68 and 69 denote partition plates for separating the plasma discharge processing container 31 from the outside.

Figure 5:
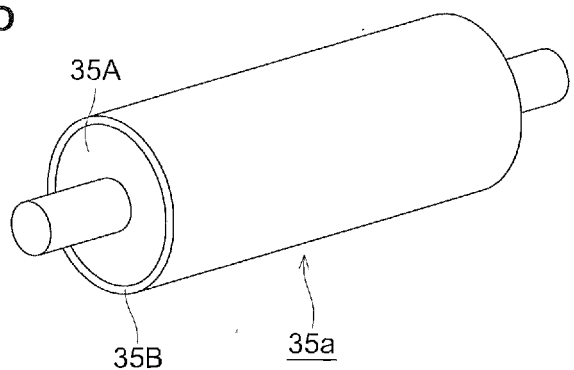
FIG. 5 is a perspective view showing an example of the conductive metallic base material of the roll rotating electrode shown in FIG. 3 and the structure of the dielectric covering the metallic base material.

FIG. 5 is a perspective view representing an example of the structures of the conductive metallic base material of the roll rotating electrode of FIG. 4 and the dielectric covering the same from above.

In FIG. 5, the roll electrode 35a is made of a conductive metallic base material 35A and the dielectric 35B covering the same from above. A medium for temperature regulation (water or silicone oil) is circulated to control the electrode surface temperature during plasma discharge processing.

Figure 6:
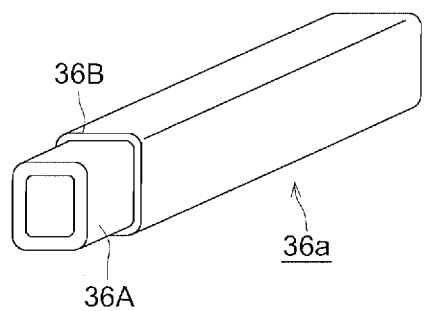
FIG. 6 is a perspective view showing an example of the conductive metallic base material of rectangular electrode shown in FIG. 3 and the structure of the dielectric covering the metallic base material.

FIG. 6 is a perspective view representing an example of the structure of the conductive metallic base material of a rectangular electrode and the dielectric covering the same.

In FIG. 6, the rectangular electrode 36a is made of a conductive metallic base material 36A covered by the dielectric 36B. The aforementioned electrode is formed as a metallic pipe, which served as a jacket to adjust the temperature for electric discharge processing.

A plurality of rectangular stationary electrodes are arranged on the circumference larger than that of the aforementioned roll electrode. The discharge area of the aforementioned electrode is expressed by the sum of the areas on the surface of all the rectangular stationary electrodes arranged face to face with the roll rotating electrode 35.

The rectangular electrode 36a of FIG. 6 can be a cylindrical electrode. As compared with the cylindrical electrode, the rectangular electrode has the effect of expanding the range of electric discharge range (discharge area), and therefore, it is preferably used in the present invention.

In FIGS. 5 and 6, after ceramics as dielectrics 35B and 36B are sprayed onto the conductive metallic base materials 35A and 36A respectively, the roll electrode 35a and rectangular electrode 36a are provided with pore sealing, using the pore sealing material of inorganic compound. The covering of the ceramic dielectric should be about 1 mm thick on one side. Alumina and silicon nitride are preferably used as the ceramic material to be sprayed. In particular, alumina is more preferably used since it can be easily processed. The dielectric layer can be a dielectric provided with lining treatment wherein inorganic material is arranged by lining.

The conductive metallic base materials 35A and 36A are exemplified by such a metal as a titanium metal or titanium alloy, silver, platinum, stainless steel, aluminum and iron, a composite material between iron and ceramic, and a composite material between aluminum and ceramic. The titanium metal or titanium alloy is preferred in particular for the reasons to be discussed later.

The distance between the opposing first and second electrodes is defined as the minimum distance between the aforementioned dielectric surface and the conductive metallic base material surface of the other electrode, when one of the electrodes is provided with a dielectric. When both electrodes are provided with dielectrics, it is defined as the minimum distance between dielectric surfaces. The distance between electrodes is determined by giving consideration to the thickness of the dielectric provided on the conductive metallic base material, the intensity of the electric field to be applied, and the object of using plasma. In any case, to ensure uniform electric discharge, this distance is preferably 0.1 through 20 mm, more preferably 0.2 through 2 mm.

The details of the conductive metallic base material and dielectric preferably used in the present invention will be described later.

The Pyrex (registered trademark) glass-made processing container is preferably used as the plasma discharge processing container 31. If insulation with the electrode is provided, a metallic product can also be used. For example, the inner surface of the aluminum or stainless steel frame may be lined with a polyimide resin. The aforementioned metal frame may be sprayed with ceramic to provide insulation. In FIG. 2, both sides of the two parallel electrodes (up to close to the substrate surface) are preferably covered with the aforementioned material.

The following commercially available products can be used as the first power source (high frequency power source) installed on the atmospheric pressure plasma discharge processing apparatus of the present invention:

Power Source for Application Manufacturer Frequency Product Name
  A1 Shinko Electric 3 kHz SPG3-4500
  A2 Shinko Electric 5 kHz SPG5-4500
  A3 Kasuga Electric 15 kHz AGI-023
  A4 Shinko Electric 50 kHz SPG50-4500
  A5 Heiden Research Laboratory 100 kHz *PHF-6k
  A6 Pearl Industry 200 kHz CF-2000-200k
  A7 Pearl Industry 400 kHz CF-2000-400k The following commercially available products can be used as the second power source (high frequency power source):

Power Source for Application Manufacturer Frequency Product Name
  B1 Pearl Industry 800 kHz CF-2000-800k
  B2 Pearl Industry 2 MHz CF-2000-2M
  B3 Pearl Industry 13.56 MHz CF-5000-13M
  B4 Pearl Industry 27 MHz CF-2000-27M
  B5 Pearl Industry 150 MHz CF-2000-150M Any of them can be used preferably.

Of the aforementioned power sources, the ones marked with an asterisk indicate an impulse high frequency power source (100 kHz in the continuous mode) manufactured by Heiden Research Laboratory. Others are high frequency power sources capable of applying only the continuous sinusoidal wave.

In the present invention, the atmospheric pressure plasma discharge processing apparatus is preferred to use the electrode capable of maintaining the state of uniform and stable electric discharging by application of the aforementioned electric field.

In the present invention, for the electric power to be applied between the opposing electrodes of the present invention, an electric power (output density) of 1 $W/cm^2$ or more is supplied to the second electrode (second high-frequency electric field). Then the electrical discharge gas is excited to generate plasma and to afford energy to a thin film forming gas, whereby a thin film is formed. The upper limit value of electric power supplied to the second electrode is preferably 50 $W/cm^2$, more preferably 20 $W/cm^2$. The lowest limit value is preferably 1.2 $W/cm^2$. It should be noted, however, that discharge area ($cm^2$) refers to the area in the range wherein electric discharging occurs between the electrodes.

When an electric power (output density) of 1 $W/cm^2$ or more is applied to the first electrode (first high-frequency electric field), the output density can be improved with the second high-frequency electric field kept uniform. This arrangement generates further uniform and high-density plasma and ensures compatibility between a further increase in the film making speed and further improvement of the film quality. The electric power is preferably 5 $W/cm^2$ or more. The upper limit value of the electric power supplied to the first electrode is preferably 50 $W/cm^2$.

There is no particular restriction to the waveform of the high-frequency electric field. There are a continuous sinusoidal wave-like continuous oscillation mode called a continuous mode, and a continuous oscillation mode for performing intermittent ON/OFF operations called a pulse mode. Either of them can be used. The continuous sinusoidal wave is preferably used at least on the second electrode (second high-frequency electric field) in order to produce a more compact and high-quality film.

The electrode used in the thin film forming method based on atmospheric pressure plasma described above is required to meet severe working conditions both in structure and performance. To meet this requirement, an electrode is preferably made of the metallic base material covered with a dielectric.

The dielectric-covered electrode used in the present invention is required to have characteristics conforming to various forms of metallic base materials and dielectrics. One of these characteristics is such a combination that ensures the difference in the linear thermal coefficient of expansion between the metallic base material and dielectric is $10 \times 10^{-6}/°$ C. or less. This difference is preferably $8 \times 10^{-6}/°$ C. or less, more preferably $5 \times 10^{-6}/°$ C. or less, still more preferably $2 \times 10^{-6}/°$ C. or less. The linear thermal coefficient of expansion in the sense in which it is used here refers to the physical properties specific to a known material.

The following shows combinations between the conductive metallic base materials and dielectrics wherein the difference in the linear thermal coefficient of expansion is kept within the aforementioned range:

1: The metallic base material is made of pure titanium or titanium alloy, and the dielectric is made of ceramic sprayed coating.

2: The metallic base material is made of pure titanium or titanium alloy, and the dielectric is made of glass lining.

3: The metallic base material is made of stainless steel, and the dielectric is made of ceramic sprayed coating.

4: The metallic base material is made of stainless steel and the dielectric is made of glass lining.

5: The metallic base material is made of a composite material of ceramic and iron, and the dielectric is made of ceramic sprayed coating.

6: The metallic base material is made of a composite material of ceramic and iron, and the dielectric is made of glass lining.

7: The metallic base material is made of a composite material of ceramic and aluminum, and the dielectric is made of ceramic sprayed coating.

8: The metallic base material is made of a composite material of ceramic and aluminum, and the dielectric is made of glass lining.

From the viewpoint of the difference in linear thermal coefficient of expansion, the aforementioned items 1 or 2 and 5 through 8 are preferably used. Item 1 is preferably used in particular.

In the present invention, from the viewpoint of the aforementioned characteristics, titanium or titanium alloy is preferably used in particular as the metallic base material. When the titanium or titanium alloy is used as the metallic base material, and the aforementioned material is used as the dielectric, it is possible to ensure a long-time use under severe conditions, free from deterioration of the electrode, cracks, peeling, disengagement or other defects during use.

The atmospheric pressure plasma discharge processing apparatus applicable to the present invention is exampled by the atmospheric pressure plasma discharge processing apparatuses disclosed in the Unexamined Japanese Patent Application Publication No. 2004-68143, the Unexamined Japanese Patent Application Publication No. 2003-49272, and International Patent 02/48428, in addition to the apparatuses discussed above, The following describes the transparent conductive film provided on the substrate of an organic EL device.

The transparent conductive film of the ITO film or the like can be produced by the vapor deposition method, plasma CVD method, or plasma CVD method under atmospheric pressure or under the pressure close thereto.

The sol-gel method (coating method) can also be used to product this film.

However, the plasma CVD method under atmospheric pressure is preferably used to produce the aforementioned film. For example, from an industrial viewpoint, the ITO film characterized by excellent conductivity equivalent to a specific resistance of about $10^4 \Omega$ can be produced using a DC magnetron sputtering apparatus. In the aforementioned physical manufacturing method (PVD method), target objects are deposited on a substrate in the gas phase so that a film is grown. Since vacuum container is used, this method involves the need of using a costly large-scale apparatus, poor efficiency in material use and poor productivity. Further, this method is not suited for formation of a film of large area. What is more, in order to ensure a product of low resistance, temperature must be increased to 200 through 300° C. at the time of film production. Thus, this method has been unsuitable to manufacture a transparent conductive film of low resistance with respect to the plastic film.

The gas used in the formation of a transparent conductive film differs according to the type of the transparent conductive film arranged on the substrate. Basically, it is a gas mixture of inert gas and reaction gas converted into plasma for formation of the transparent conductive film, similarly to the case of the above. The inert gas includes the Group XVIII elements of the Periodic Table such as helium, neon, argon, krypton, xenon and radon as well as nitrogen gas, similarly to the case of the above. Argon and helium are preferably used in particular. A plurality of reaction gases can be used in the present invention. In this case, at least one of them is converted into plasma in the discharge space, and the components for forming the transparent conductive film are contained therein. Although there is no particular restriction to such gases, an organic metallic compound is preferably used. No restriction is imposed of the type of the organic metallic compound, but the organic metallic compound containing oxygen in the molecule is preferred. The substances preferred in particular are organic metallic compounds such as β diketone metal complex, metallic alkoxide and alkyl metal. More preferably used are the reaction gases made up of the compound selected from such compounds as indium hexafluoro pentane dionate, indium methyl(trimethyl)acetyl acetate, indium acetyl acetonate, indium isopropoxide, indium trifluoro pentane dionate, tris(2,2,6,6-tetramethyl 3,5-heptane dionate)indium, di-n-butylbis(2,4-pentane dionate)tin, di-n-butyl diacetoxy tin, di-t-butyl diacetoxy tin, tetraisopropoxy tin, tetrabutoxy tin, and zinc acetyl acetonate.

Of these, particularly preferred substances are indium acetyl acetonate, tris(2,2,6,6-tetramethyl 3,5-heptane dionate)indium, zinc acetyl acetonate and di-n-butyl diacetoxy tin. These organic metallic compounds are available on the market. For example, indium acetyl acetonate can be procured easily from Tokyo Chemical Industry Co., Ltd.

In the formation of the conductive film, in addition to the organic metallic compounds containing one or more oxygen atoms in these molecules, the gas used for doping for the purpose of improving conductivity can be used. The reaction gas used for doping is exemplified by aluminum isopropoxide, nickel acetyl acetonate, manganese acetyl acetonate, boron isopropoxide, n-butoxy antimony, tri-n-butyl antimony, di-n-butyl bis(2,4-pentane dionate)tin, di-n-butyl diacetoxy tin, di-t-butyl diacetoxy tin, tetraisopropoxy tin, tetrabutoxy tin, tetrabutyl tin, zinc acetyl acetonate, propylene hexafluoride, cyclobutane octofluoride and methane tetrafluoride.

Further, in addition to the reaction gas containing the components of the transparent conductive film, water can be used as a reaction gas, whereby transparent conductive film characterized by excellent conductivity and etching speed can be produced. The amount of water added to the reaction gas is preferably 0.0001% by volume through 10% by volume, more preferably 0.001 through 1% by volume, in the gas mixture between the reaction gas and inert gas.

The reaction gas of the present invention that can be used in the present invention can be exemplified by the organic metallic compound including the elements constituting the transparent conductive film, and water, oxidizing substance such as oxygen, reducing gas such as hydrogen, nitrogen monoxide, nitrogen dioxide, carbon monoxide and carbon dioxide.

The quantitative ratio of the reaction gas used as the major component of the transparent conductive film relative to the reaction gas used in a small quantity for the purpose of doping varies according to the type of the transparent conductive film to be formed. For example, in the ITO film obtained by doping tin into the indium oxide, the amount of the reaction gas is adjusted so that the ratio of the number of In atoms relative to that of Sn atoms in the ITO film obtained will be 100:0.1 through 100:15. The ratio of the number of In atoms relative to that of Sn atoms can be obtained from the XPS measurement. In the transparent conductive film (also called FTO film) obtained by doping fluorine into tin oxide, the amount of the reaction gas is adjusted so that the ratio of the number of Sn atoms relative to that of F atoms in the FTO film obtained will be 100:0.01 through 100:50. The ratio of the number of Sn atoms relative to that of F atoms can be obtained from the XPS measurement. In the $In_2O_3$—ZnO based amorphous transparent conductive film, the amount of the reaction gas is adjusted so that the ratio of the number of the In atoms relative to that of Zn atoms will be 100:50 through 100:5. The ratio of the number of In atoms relative to that of Zn atoms can be obtained from the XPS measurement.

The reaction gas is available in two types; the reaction gas used as the major component of the transparent conductive film, and the reaction gas used in a small quantity for the purpose of doping. Further, in the present invention, the metallic element as the major component of the transparent conductive film, the metallic element for doping, and silicon are also introduced. There is no particular restriction to the method of introducing the silicon. When a transparent conductive film is formed, reaction gas can be added in order to adjust the resistance of the transparent conductive film. The reaction gas preferably used to adjust the resistance of the transparent conductive film is exemplified by an organic metallic compound, especially β diketone metal complex, metallic alkoxide and alkyl metal. To put it more specifically, the silicon compound is exemplified by tetramethoxy silane, tetraethoxy silane, tetra-iso-propoxy silane, tetra-n-propoxy silane, tetra-n-butoxy silane, tetra-sec-butoxy silane, tetra-tert-butoxy silane, tetra-penta-ethoxy silane, tetra-penta-iso-propoxy silane, tetra-penta-n-propoxy silane, tetra-penta-sec-butoxy silane, tetra-penta-tert-butoxy silane, methyl trimethoxy silane, methyl triethoxy silane, methyl tripropoxy silane, methyl tributhoxy silane, dimethyl dimethoxy silane, dimethyl ethoxy silane, dimethyl methoxy silane, dimethyl propoxy silane, dimethyl buthoxy silane, methyl dimethoxy silane, methyl diethoxy silane, and hexyl trimethoxy silane.

Of these, tetraethoxy silane is preferably used.

The thickness of the transparent conductive film is preferably 0.1 nm through 1000 nm.

After having been formed under the pressure close to the atmospheric pressure, the transparent conductive film can be heated to adjust the characteristics of the transparent conductive film. The amount of hydrogen in the film can be changed by this heat treatment. The temperature for heat treatment is preferably 50 through 300° C., more preferably 100 through 200° C. There is no particular restriction to the atmosphere of heating. Any proper atmosphere can be selected from among air atmosphere, reducing atmosphere including the reducing gas such as hydrogen, oxidizing atmosphere including oxidizing gas such as oxygen, vacuum and inert gas atmosphere. When the reducing and oxidizing atmospheres are adopted, it is preferred to use the reducing and oxidizing gases diluted by a rare gas or nitrogen. In this case, the concentration of the reducing and oxidizing gases is preferably 0.01 through 5% by volume, more preferably 0.1 through 3% by volume.

The transparent conductive film obtained by the transparent conductive film forming method of the present invention may contain carbon since organic metallic compound is used as a reaction gas. In this case, the amount of the carbon contained therein is preferably 0 through 5.0, more preferably 0.01 through 3, in terms of the concentration in the number of atoms.

In the present invention, the aforementioned ceramic film or transparent conductive film is formed under the pressure close to the atmospheric pressure, but there is no particular restriction to the temperature of the substrate used in this case. When glass is used as a substrate, this temperature is preferably 300° C. or more. When the polymer (to be described later) is used this temperature is preferably 200° C. or more.

The following describes the organic EL device using the aforementioned gas barrier film and a resin substrate for organic EL device with the transparent conductive film formed on the gas barrier film:

(Sealing Film and its Manufacturing Method)

The present invention is partly characterized in that the gas barrier film having the aforementioned ceramic film is used as a substrate.

In the gas barrier film having the aforementioned ceramic film, a transparent conductive film is further formed on the ceramic film. This is used as an anode, and an organic EL material layer for correcting the organic EL device, and a metallic layer as a cathode are laminated on this anode. Further, another gas barrier film as a sealing film is bonded thereon, whereby sealing is provided.

The gas barrier film having a ceramic film of compact structure of the present invention can be used as another sealing material (sealing film). Further, for example, it is possible to use as a sealing film the commonly known gas barrier film used for packaging, as exemplified by the film with silicone oxide or aluminum oxide vapor-deposited on a plastic film, or a gas barrier film with a compact ceramic layer and a impact reducing polymer layer of superb flexibility alternately laminated thereon. Although it cannot be used as a gas barrier film on the lighting side, the resin laminated metal foil (polymer film) in particular is a low-cost sealing material of low moisture permeability, and can be used preferably as a sealing film when it is not intended for lighting purposes (when transparency is not required).

In the present invention, unlike the metallic thin film formed by sputtering or vapor deposition, or the conductive film made of the liquid electrode material such as a conductive paste, the metal foil refers to the metal foil or film formed by rolling operation.

There is no particular restriction to the metal foil, which is exemplified by a copper (CU) foil, aluminum (Al) foil, gold (Au) foil, brass foil, nickel (Ni) foil, titanium (Ti) foil, copper alloy, stainless steel foil, tin (Sn) foil and high-nickel allow foil.

The thickness of the metal foil is preferably 6 through 50 μm. If it is below 6 μm, a pin hole may be created at the time of use, depending on the type of the material used for the metal foil, and the required barrier function (moisture permeability, oxygen permeability) cannot be obtained in some cases. If the thickness is over 50 μm, the production cost may be increased, depending on the type of the material used for the metal foil, or the thickness of the organic EL device may be increased, with the result that the advantages of the film cannot be provided in some cases.

In the metal foil with the resin film (polymer foil) laminated thereon, various materials disclosed in the "New Development in the Functional Packaging Materials" (Toray Research Center) can be used as a resin film. Examples are polyethylene resin, polypropylene resin, polyethylene terephthalate resin, polyamide resin, ethylene-vinyl alcohol copolymer resin, ethylene-vinyl acetate copolymer resin, acrylonitryl-butadiene copolymer resin, cellophane resin, vinylon resin, and polyvinylidene chloride. The polypropylene resin and nylon resin can be drawn, or can be coated with the polyvinylidene chloride resin. The polyethylene resin of either low density or high density can be utilized.

Of the aforementioned high polymer materials, nylon (Ny), nylon (KNy) coated with vinylidene chloride (PVDC), unoriented polypropylene (CPP), oriented polypropylene (OPP), polypropylene (KOP) coated with the PVDC, polyethylene terephthalate (PET), cellophane (KPT) coated with the PVDC, polyethylene-vinyl alcohol copolymer (Eval), low-density polyethylene (LDPE), high-density polyethylene (HDPE), and linear low-density polyethylene (LLDPE) can be employed. Needless to say, a multilayer film formed by co-extrusion with a different type of film as required and a multilayer film laminated by changing the drawing angle can be used as these thermoplastic films. It is naturally possible to create the film by a combination of the distributions of the density and molecular weight of the film used to ensure the required physical properties of the packaging material.

The thickness of the polymer film cannot be regulated indiscriminately. It is preferably 3 through 400 μm, more preferably 10 through 200 μm, still more preferably 10 through 50 μm.

A generally used laminating machine can be used to coat (laminate) the polymer film on one surface of the metal foil. A polyurethane, polyester, epoxy or acryl based adhesive can be utilized. A curing agent can be used as required. The dry lamination method, hot melt lamination method and extrusion lamination method can be employed. Use of the dry lamination method is preferred.

The film coated with polymer film on one surface of the metal foil is commercially available for use in packaging materials. For example, the dry lamination film having a structure of an adhesive layer, aluminum film (9 μm) and polyethylene terephthalate (PET, 38 μm) (two-part adhesive type urethane based adhesive having a thickness of 1.5 μm as the adhesive layer) is available on the market. This film can be used to seal the cathode side of the organic EL device.

As will be described later, two films are preferably sealed by the method of laminating a commonly used impulse sealer thermal fusing type resin layer and fusing with the impulse sealer. In this case, when gas barrier films are sealed with each other, film handling difficulties will arise at the time of sealing operation if film thickness exceeds 300 μm. Further, thermal fusing difficulties due to the impulse sealer and other factors will arise. To avoid this, the film thickness is preferably kept not to exceed 300 μm.

[Sealing of Organic EL Device]

After each layer of the organic EL device has been formed on the resin substrate for organic EL device with a transparent conductive film formed on the resin film having the aforementioned ceramic film of the present invention, the surface coated with the ceramic film seals the organic EL device so as to cover the cathode surface under the environment wherein air was purged by an inert gas, using the aforementioned sealing film.

Helium or argon in addition to nitrogen is preferably used as the inert gas. The rare gas made up of a mixture of helium and argon is also preferably used. The percentage of the inert gas in the entire gas is preferably 90 through 99.9% by volume.

Storage stability is improved by sealing under the environment wherein purging is conducted by an inert gas.

It is important that the ceramic film surface of the sealing film should be bonded on the cathode of the organic EL device. If the polymer film surface of the sealing film is bonded on the cathode of the organic EL device, partial conduction or electrolytic corrosion may occur as described above. This may further lead to occurrence of a dark spot.

In one of the method for bonding the sealing film on the cathode of the organic EL device, the resin films that can be fusion-bonded by the commonly used impulse sealer, as exemplified by a vinyl ethylene acetate copolymer (EVA) film, polypropylene (PP) film or polyethylene (PE) film, are laminated, and are fuse-bonded by impulse sealer, wherein sealing is provided.

Dry lamination method is preferable for this bonding from the viewpoint of workability. In this method, an adhesive layer having a curing property of about 1.0 through 2.5 μm is generally used. However, if the excessive amount of the adhesive is coated, a tunnel, oozing out or fine wrinkles occur. Accordingly, the amount of adhesive is preferably 3 through 5 μm in terms of dried film thickness.

The hot melt lamination method refers to a method of melting the hot melt adhesive and coating an adhesive layer on the substrate, wherein the thickness of the adhesive layer generally can be set over a wide range from 1 through 50 μm. EVA, EEA, polyethylene, butyl rubber or the like is used as the base resin of the hot melt adhesive generally used. Rosin, xylylene resin, terpene resin or styrene resin is added as a tackifier, and wax or the like is added as a plasticizer.

Extrusion lamination method refers to the method of coating the substrate with the resin melted at a high temperature by means of dies. The thickness of the resin layer can be generally set over a wide range from 10 through 50 μm.

LDPE, EVA, PP or the like is generally used as the resin used for extrusion lamination.

Figure 7:
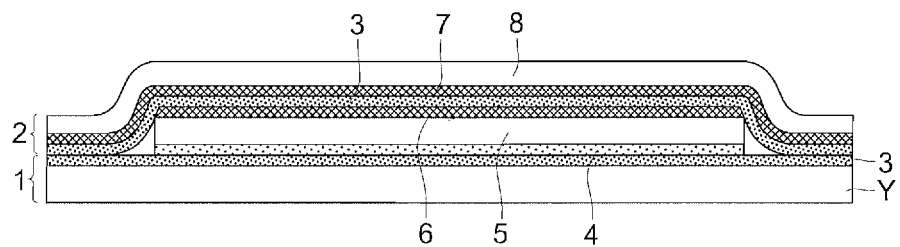
FIG. 7 is a schematic view showing the cross section of an organic electroluminescent device sealed with the gas barrier film of the present invention.

FIG. 7 is a schematic view showing the cross section representing the organic EL device sealed by the step wherein, after each layer of the organic EL device has been formed on the gas barrier film of the present invention, the resin laminated aluminum foil with silicon oxide, and the aforementioned gas barrier film are further bonded.

In FIG. 7, an organic EL device containing an anode (ITO) 4, each layer 5 of the organic EL device including the light emitting layer and a cathode (e.g., aluminum) 6 formed thereon is formed on the gas barrier film 1 having a ceramic film 3 of the present invention formed on the resin film substrate Y. Further, another sealing film 2 is placed on the cathode and the position around the substrate film is bonded, whereby the organic EL device including the organic EL material layer is sealed. In the sealing film 2, the ceramic film 3 is formed on the metal (aluminum) foil 7 and the resin layer 8 is laminated on the side opposite the metal foil, wherein the sealing film 2 is bonded so as to contact the side of the ceramic film 3.

The following describes the each layer of the organic EL material (constituent layer):

[Organic EL Device]

The following describes the details of the constituent layer of the organic EL device of the present invention. The following describes the preferred examples of the structure of the organic EL device layer, without the present invention being restricted thereto.

(1) Anode/light emitting layer/electron transport layer/cathode (2) Anode/positive hole transport layer/light emitting layer/electron transport layer/cathode (3) Anode/positive hole transport layer/light emitting layer/electron transport layer/cathode (4) Anode/positive hole transport layer/light emitting layer/electron transport layer/cathode buffer layer/cathode (5) Anode/anode buffer layer/positive hole transport layer/light emitting layer/positive hole blocking layer/electron transport layer/cathode buffer layer/cathode (Anode)

The anode of the organic EL device preferably used is the one wherein a metal having a greater work function (4 eV or more), alloy, electrically conductive compound, or the mixture thereof is used as an electrode substance. Such an electrode substance is a conductive transparent material exemplified by a metal such as gold, CuI, indium tin oxide (ITO), $SnO_2$ or ZnO. It is also possible use the material that can be used to produce a amorphous transparent, conductive film of IDIXO ($In_2O_3$—ZnO) or the like. In the anode, a thin film has been formed on these electrode substances by vapor deposition or sputtering method and a desired shape pattern is formed by photolithography. Alternatively, when a high pattern accuracy is not required (about 100 μm or more), a pattern can be formed by means of a mask having a desired shape pattern at the time of the vapor deposition or sputtering of the aforementioned substance. When picking up the light emitted from this anode, the transmittance is preferably greater than 10%. The sheet resistance as the anode is preferably a few hundred $\Omega/\square$ or less. The film thickness is preferably 10 through 1000 nm, more preferably 10 through 200 nm, although it may differ according to the type of the material.

(Cathode)

In the meantime, the cathode of the organic EL device preferably used is the one wherein a metal having a smaller work function (4 eV or less) (called an electron injection type metal), alloy, electrically conductive compound, or the mixture thereof is used as an electrode substance. Such an electrode substance is exemplified by sodium, sodium-cadmium alloy, magnesium, lithium, magnesium/copper mixture, magnesium/silver mixture, magnesium/aluminum mixture, magnesium/indium mixture, aluminum/aluminum oxide ($Al_2O_3$) mixture, indium, lithium/aluminum mixture, and rare-earth metal. Of these substances, a mixture between the electron injection type metal and the second metal as a stable metal having a greater work function thereby is preferably utilized from the viewpoint of effective electron injection and durability to oxidation, wherein the aforementioned mixture is exemplified by magnesium/silver mixture, magnesium/aluminum mixture, magnesium/indium mixture, aluminum/aluminum oxide ($Al_2O_3$) mixture, lithium/aluminum mixture, and aluminum. The cathode can be manufactured by forming a thin film by vapor deposition or sputtering method of these electrode substances. The sheet resistance as the cathode is preferably a few hundred $\Omega/\square$ or less. The film thickness is preferably 10 nm through 5 more preferably 50 through 200 nm. To allow passage of the emitted light, if either the anode or cathode of the organic EL device is transparent or translucent, the light emitting luminance is preferably improved.

After the aforementioned metal is formed on the cathode to a film thickness of 1 through 20 nm, the transparent conductive film mentioned with reference to the description of the anode is formed thereon, whereby a transparent or translucent cathode can be produced. This can be applied to produce a device wherein both the anode and cathode are transparent.

The following describes the injection layer, blocking layer and electron transport layer used as the constituent layers of the organic EL device of the present invention:

(Injection Layer: Electron Injection Layer and Positive Hole Injection Layer)

The injection layer is provided as required. It is available in two types; an electron injection layer and a positive hole injection layer. It can be located between the anode and light emitting layer or positive hole injection layer, and between the cathode and light emitting layer or electron transport layer, as described above.

The injection layer can be defined as a layer provided between the electrode and organic layer in order to reduce the drive voltage and to improve the light emitting luminance. The details are described in the "Organic EL Device and Forefront of its Industrialization", Part 2, Chapter 2 "Electrode Material", PP. 123-166, by N.T.S. Nov. 30, 1998. It is available in two types; a positive hole injection layer (anode buffer layer) and an electron injection layer (cathode buffer layer).

The details of the anode buffer layer (positive hole injection layer) are disclosed in the Unexamined Japanese Patent Application Publications Nos. H9-45479, H9-260062 and H8-288069. This layer is exemplified by a phthalocyanine buffer layer as represented by copper phthalocyanine, an oxide buffer layer as represented by vanadium oxide, an amorphous carbon buffer, and a high molecular buffer layer using a conductive high polymer such as polyaniline (emeraldine) and polythiophene.

The details of the cathode buffer layer (electron injection layer) are disclosed in the Unexamined Japanese Patent Application Publications Nos. H6-325871, H9-17574, and H10-74586. It can be exemplified by a metallic buffer layer represented by strontium and aluminum, an alkali metal compound buffer layer represented by lithium fluoride, an alkali earth metal compound buffer layer represented by magnesium fluoride, and an oxide buffer layer represented by aluminum oxide. These buffer layers (injection layers) preferably have a very thin film and the film thickness is preferably 0.1 nm through 5 μm.

(Blocking Layer: Positive Hole Blocking Layer and Electron Blocking Layer)

As described above, the blocking layer is provided as required, in addition to the basic constituent layer of the organic compound thin film. This is exemplified by the positive hole blocking layer (hole block layer) disclosed in the Unexamined Japanese Patent Application Publications Nos. H11-204258 and H11-204359, and "Organic EL Device and Forefront of its Industrialization", P. 237 by N.T.S. Nov. 30, 1998.

The positive hole blocking layer in the broader sense is made up of a positive hole blocking material having an electron transport layer and a function of transporting electrons wherein the capability of transporting the positive hole is very small. The probability of reconnection between the electrons and positive hole can be improved by transporting electrons and blocking the positive hole. Further, the structure of the electron transport layer can be used, wherever required, as the positive hole blocking layer of the present invention to be described later.

The electron blocking layer in the broader sense is made up of a material having a function of the positive hole transport layer and a function of transporting positive holes wherein the capability of transporting the electron is very small. The probability of reconnection between the electrons and positive hole can be improved by transporting positive holes and blocking the electrons. Further, the structure of the positive hole transport layer can be used, wherever required, as the electron blocking layer of the present invention to be described later.

(Light Emitting Layer)

The light emitting layer of the present invention can be defined as a layer wherein light is emitted by reconnection of the electron and positive hole injected from the electron, electron transport layer or positive hole transport layer. The light emitting portion can be located either inside the light emitting layer or on the interface with the adjacent layer.

The light emitting layer of the organic EL device of the present invention preferably contains the following host compound and dopant compound. This will enhance the light emitting efficiency.

The light emitting can be broadly classified into two types; a fluorescent dopant for emitting fluorescent light and a phosphorescent dopant for emitting phosphorescent light.

The former (fluorescent dopant) is exemplified by a coumarin pigment, pyran pigment, cyanine pigment, croconium pigment, squalium pigment, oxobenzanthracene pigment, fluorescein pigment, rhodamine pigment, pyrylium pigment, perylene pigment, stilbene pigment, polythiophene pigment, or rare-earth complex fluorophore.

The latter (phosphorescent dopant) is represented preferably by the complex compounds containing the Croup VIII, IX and X metals of the Periodic Table, more preferably by iridium compound and osmium compound. Of these, the indium compound is preferred in particular. The specific examples are given below:

International Publication No. 00/70655 (leaflet), Unexamined Japanese Patent Application Publications Nos. 2002-280178, 2001-181616, 2002-280179, 2001-181617, 2002-280180, 2001-247859, 2002-299060, 2001-313178, 2002-302671, 2001-345183 and 2002-324679, International Publication No. 02/15645 (leaflet), Unexamined Japanese Patent Application Publications Nos. 2002-332291, 2002-50484, 2002-332292, 2002-83684, 2002-540572 (Tokuhyo), 2002-117978, 2002-338588, 2002-170684, 2002-352960, International Publication No. 01/93642 (leaflet), Unexamined Japanese Patent Application Publications Nos. 2002-50483, 2002-100476, 2002-173674, 2002-359082, 2002-175884, 2002-363552, 2002-184582, 2003-7469, 2002-525808, 2003-7471, 2002-525833, 2003-31366, 2002-226495, 2002-234894, 2002-235076, 2002-241751, 2001-319779, 2001-319780, 2002-62824, 2002-100474, 2002-203679, 2002-100474, 2002-203679, 2002-343572, and 2002-203678.

Some of the specific examples will be given below:

[Chemcial Formula 1]

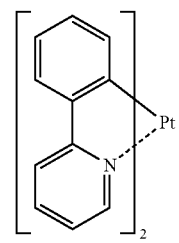

Pt-1

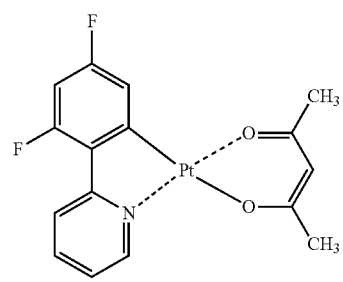

Pt-2

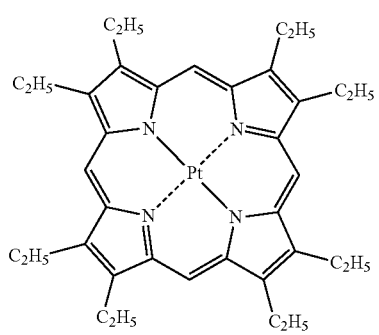

Pt-3

A-1
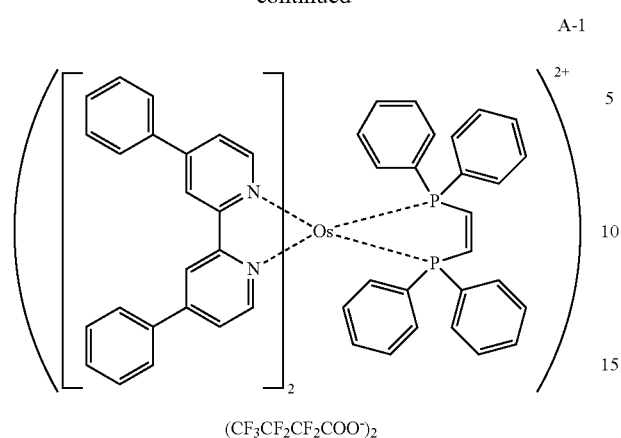
(CF₃CF₂CF₂COO⁻)₂
[Chemical Formula 2]
Ir-1
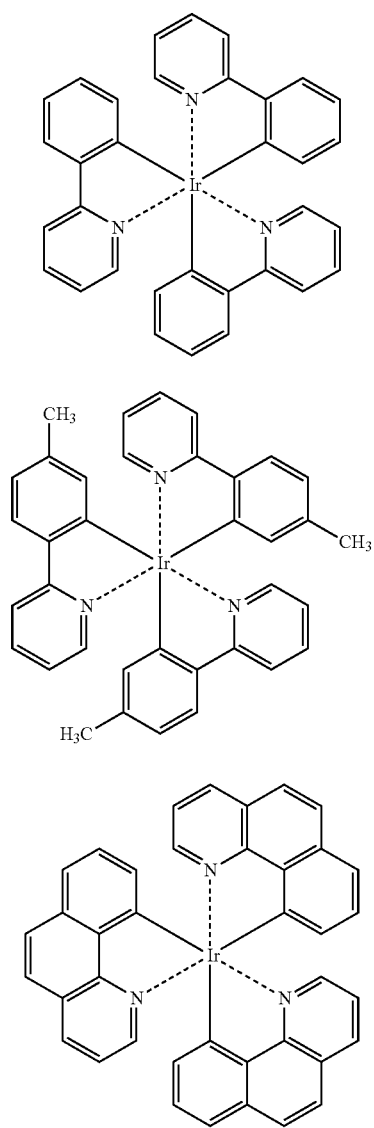
Ir-2
Ir-3
Ir-4
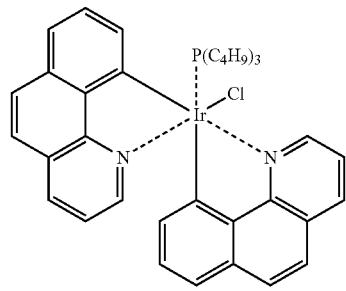
Ir-5
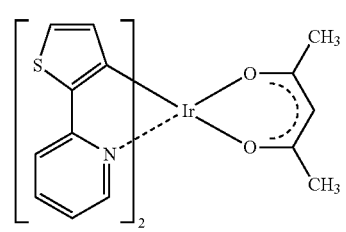
Ir-6
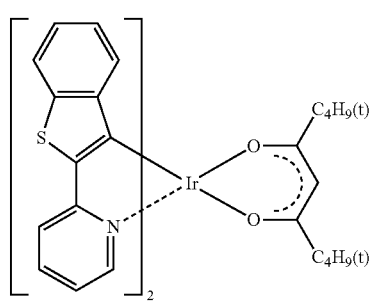
[Chemical Formula 3]
Ir-7
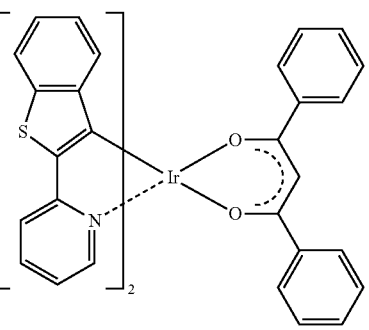
Ir-8
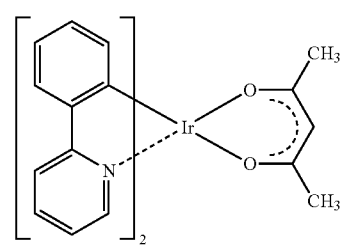

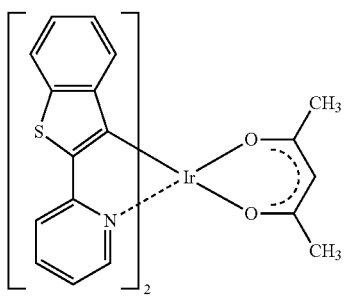

Ir-9

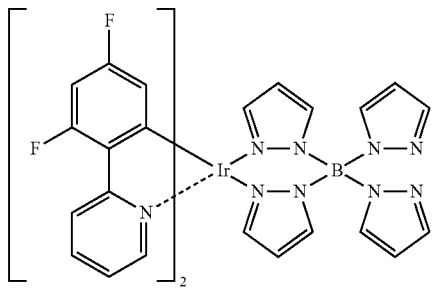

Ir-13

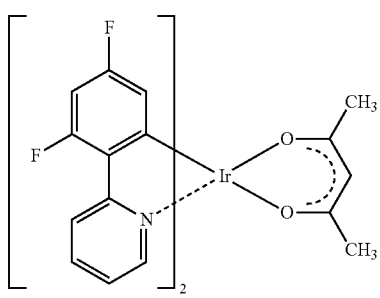

Ir-10

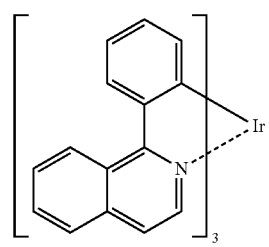

Ir-14

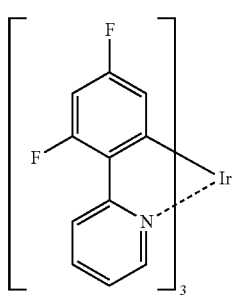

Ir-11

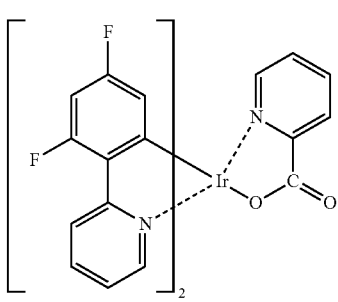

Ir-12

A plurality of types of light emitting dopants may be mixed for use.

<Light Emitting Host>

The light emitting host (also called host) refers to a compound having the greatest mixture ratio (mass) in the light emitting layer made up of two or more compounds. Other compounds will be called "dopant compounds" (or simply "dopant"). For example, assume that a light emitting layer is made up of two substances, compounds A and B, and the mixture ratio is A:B=10:90. Then the compound A is the dopant compound, and the compound B is a host compound. Further, assume that the light emitting layer is made up of three compounds, compounds A, B and C, and the mixture ration is A:B:C=5:10:85. Then the compounds A and B are dopant compound and the compound C is a host compound.

There is no structural restriction to the light emitting host used in the present invention. It is typically represented by a carbazole derivative, triallyl amine derivative, aromatic boron derivative, nitrogen-containing heterocyclic compound, thiophene derivative, furan derivative, a derivative having a basic framework such as an oligoallylene compound, or carboline derivative and diazacarbazole derivative (wherein the diazacarbazole derivative refers to the derivative wherein at least one carbon atom of the hydrocarbon ring constituting the carboline ring of the carboline derivative is replaced by the nitrogen atom.

Of these, the carboline derivative and diazacarbazole derivative are preferably utilized.

The following shows specific examples of the carboline derivative and diazacarbazole derivative without the present invention being restricted thereto.

[Chemical Formula 4]
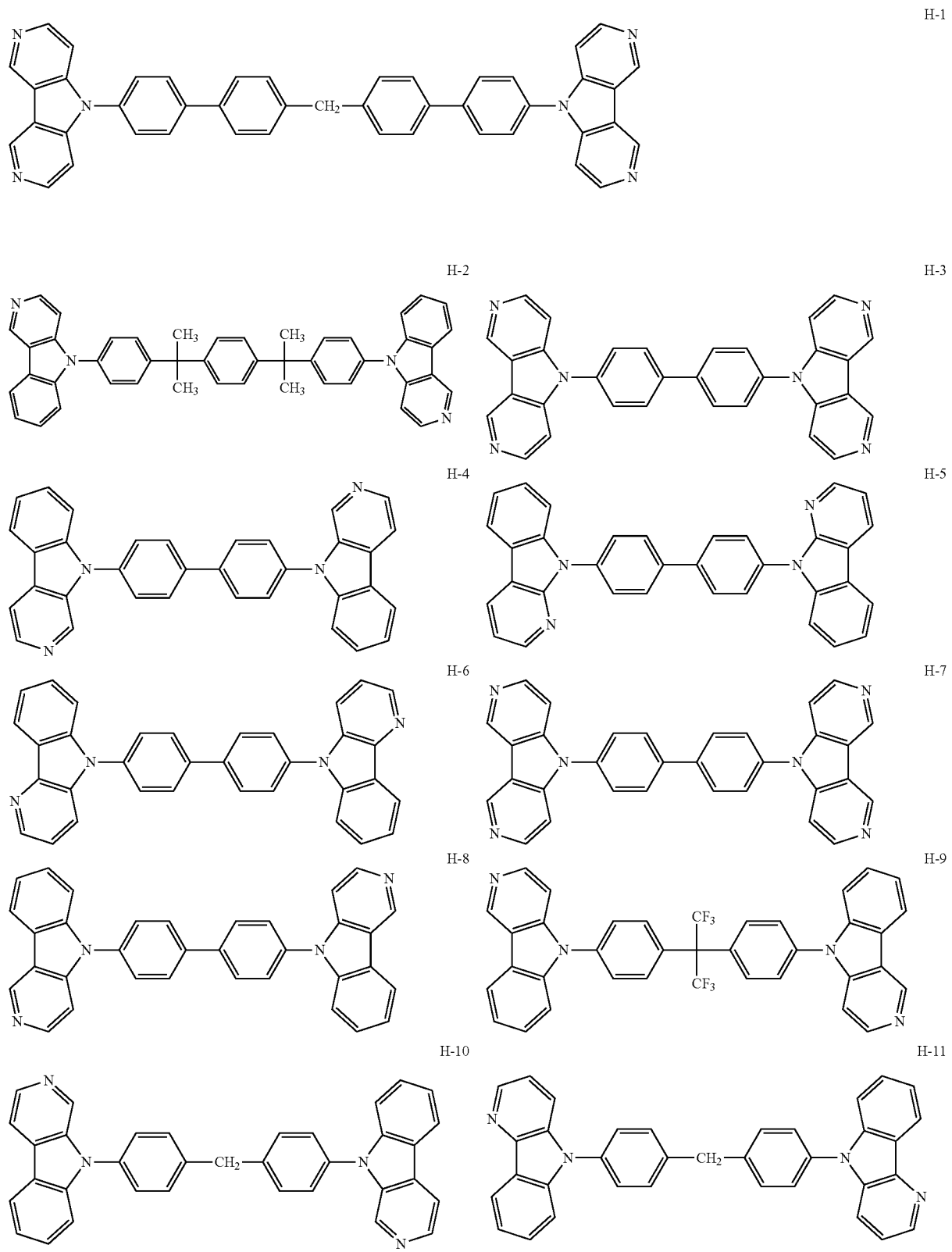

[Chemical Formula 5]

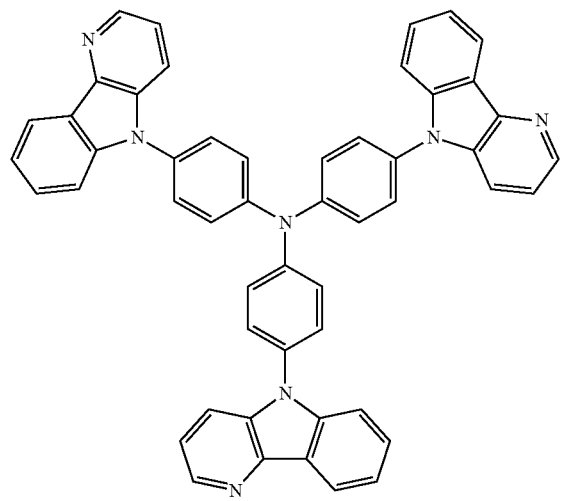
H-12

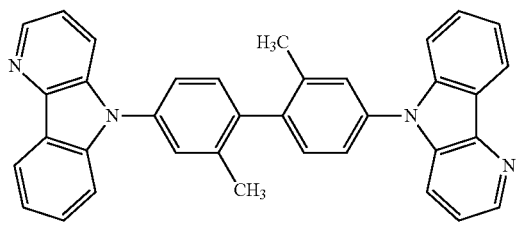
H-13

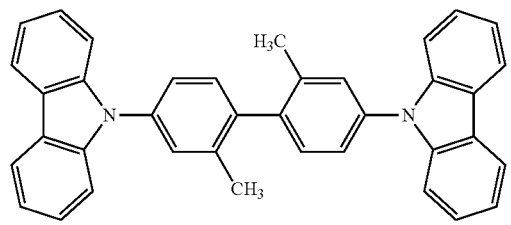
H-14

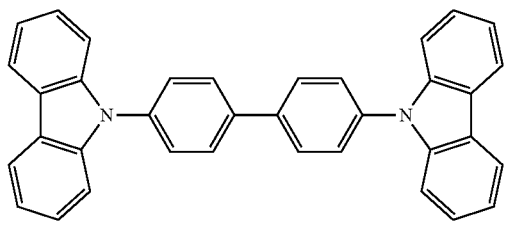
H-15

-continued

The light emitting host used in the present invention can be a low-molecular compound, a high molecular compound having a repeating unit, or a low-molecular compound having a polymerizable group such as vinyl or epoxy group (vapor deposited polymerizable light emitting host).

A compound having positive hole and electron transport functions, capable of preventing the increase in the wave length of the emitted light, and having a high Tg value (glass transition temperature) is preferably used as a light emitting host. The light emitting host is exemplified by the compounds disclosed in the following documents: Unexamined Japanese Patent Application Publications Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084, and 2002-308837.

A plurality of the commonly known host compounds can be used in combination. A plurality of the dopant compounds can also be used in combination. This permits different beams of light to be mixed, and allows a desired light color to be emitted. Thus, white light can be emitted by adjusting the type of the phosphorescent compound and amount of the dope, and can be used for illumination and backlight.

The color of the light emitted from the organic EL device in the present invention is determined by the color when the result of measurement by a spectral radiation luminance meter CS-1000 (by Konica Minolta Sensing) disclosed in "A Handbook of New Color Science" by Japan Society of Colors, the Publishing Organization of the University of Tokyo, 1985. P. 108 (FIG. 4.16), is applied to the CIE chromaticity coordinate.

The light emitting layer can be produced by forming the aforementioned compound into a thin film according to the known thin film forming methods such as a vapor deposition method, spin coating method, casting method, LB method, and inkjet method. There is no particular restriction to the film thickness of the light emitting layer, but in normal cases, this thickness is preferably 5 nm through 5 μm, more preferably 5 through 200 nm. This light emitting layer can be designed to have a single layer structure made up of one or more than two host compounds. Alternatively, it can be a lamination structure containing a plurality of layers made up of the same compounds or different types of compounds.

(Positive Hole Transport Layer)

The positive hole transport layer is made of a positive hole transport material having a function of transporting the positive hole, and includes a positive hole injection layer, electron blocking layer and positive hole transport layer in the broader sense of the term. A single positive hole transport layer or a plurality of positive hole transport layers can be provided.

The positive hole transport material is either a positive hole injection function or a transport barrier function. It can be either organic or inorganic. For example, it includes triazole derivative, oxydiazole derivative, imidazole derivative, polyallyl alkane derivative, pyrazoline derivative, pyrazolone derivative, phenylene diamine derivative, aryl amine derivative, amino-substituted chalcone derivative, oxazole derivative, styryl anthracene derivative, fluorenone derivative, hydrazone derivative, stilbene derivative, silazane derivative, aniline copolymer, conductive high molecular oligomer, and thiophene oligomer in particular.

The aforementioned substances can be used as the positive hole transport materials. Use of the porphyrin compound, aromatic tertiary amine compound, and styryl amine compound, is preferred. Of these compounds, the aromatic tertiary amine compound is preferably used in particular.

The aromatic tertiary amine compound and styryl amine compound is typically exemplified by N,N,N',N,'-tetraphenyl-4,4'-diamino phenyl; N,N'-diphenyl-N,N'-bis(3-methyl phenyl)-[1,1'-biphenyl]-4,4'-diamine (TPD); 2,2-bis(4-di-p-tolylamino phenyl)propane; 1,1-bis(4-di-p-tolylamino phenyl) cyclohexane; N,N,N',N'-tetra-p-tolyl-4,4'-diamino biphenyl; 1,1-bis(4-di-p-tolylamino phenyl)-4-phenyl cyclohexane; bis(4-dimethylamino-2-methylphenyl)phenylmethane; bis(4-di-p-tolylamino phenyl)phenylmethane; N,N'-diphenyl-N,N'-di(4-methoxyphenyl)-4,4'-diaminobiphenyl; N,N,N',N'-tetraphenyl-4,4'-diaminodiphenyl ether; 4-4'-bis(diphenyl amino)quadriphenyl; N,N,N-tri(p-tolyl) amine; 4-(di-p-tolylamino)-4'-[4-(di-p-tolylamino)styryl] stylbene; 4-N,N-diphenylanino-(2-diphenylvinyl)benezene; 3-methoxy-4'-N,N-diphenylamino stilbenezene; N-phenyl carbazole; and the substrates whose the molecule contains two condensed aromatic rings disclosed in the Specification of the U.S. Pat. No. 5,061,569 as exemplified by 4,4'-bis[N-(1-naphthyl)-N-phenylamino]biphenyl (NPD), 4,4',4"-tris [N-(3-mehylphenyl)-N-phenyl amino]triphenyl amine (MT-DATA) disclosed in the Unexamined Japanese Patent Application Publication No. H4-308688 wherein the triphenyl amine unit is linked with three star burst type.

It is also possible to use the high molecular material wherein these materials are introduced into the high molecular chain or these materials are used as the principal chain of the high polymer. Further, the inorganic compound of p-type-Si or p-type-SiC can also be used as a positive hole injection material or a positive hole transport material.

The positive hole transport layer can be produced by forming the aforementioned positive hole transport material into a thin film by the commonly known method such as the vapor deposition method, spin coating method, casting method and printing method including the inkjet method, and LB method. There is no particular restriction to the thickness of the film of the positive hole transport layer. Normally this thickness is preferably about 5 nm through 5 μm, more preferably 5 through 200 nm. The positive hole transport layer can be designed to have a single layer structure made up of one or more than two of the aforementioned materials.

It is also possible to use a positive hole transport layer of high p-type doped with impurities. This is exemplified by the products disclosed in the Unexamined Japanese Patent Application Publications Nos. H4-297076, 2000-196140 and 2001-102175, as well as in J. Appl. Phys., 95, 5773 (2004).

(Electron Transport Layer)

The electron transport layer is made of a material having a function of transporting the electron, and includes an electron injection layer, positive hole blocking layer and electron transport layer in the broader sense of the term. A single electron transport layer or a plurality of electron transport layers can be provided.

In the conventional practice, in the case of a single electron transport layer or a plurality of electron transport layers, the electron transport layer (also serving as a positive hole blocking material) used in the electron transport layer adjacent to the cathode side with respect to the light emitting layer is only required to have a function of transmitting the electron injected from the cathode, to the light emitting layer. A desired material can be selected for use from the commonly known compounds, which are exemplified by a nitro-substituted fluorene derivative, diphenyl quinone derivative, thiopyran oxide derivative, carbodiimide, phleonyliden methane derivative, anthraquino dimethane, enthrone derivative and oxadiazole derivative. Further, in the aforementioned oxadiazole derivative, the quinoxaline derivative containing a quinoxaline ring known as an electron suction group and the thiadiazole derivative gained by replacing the oxygen atom of the oxadiazole ring with the sulfur atom can also be used as an electron transport layer. Further, it is also possible to use the high molecular material wherein these materials are introduced into the high molecular chain or these materials are used as the principal chain of the high polymer.

A metallic complex of 8-quinolinol derivative exemplified by tris(8-quinolinol)aluminum (Alq), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum, bis(8-quinolinol)zinc (Znq), or the complex wherein the central metal of these metallic complexes is replaced by In, Mg, Cu, Ca, Sn, Ga or Pb can also be used as an electron transport material. Further, the substance wherein metal-free, metal phthalocyanine or the terminal thereof is replaced by an alkyl group, or sulfonic acid group can also be preferably used. Further, the distyrylpyrazine derivative as exemplified as the material of the light emitting layer can also be used as an electron transport layer. Similarly to the case of the positive hole injection layer and positive hole transport layer, an inorganic semiconductor such as n-type-Si and n-type-SiC can also be used as an electron transport material.

The electron transport layer can be produced by forming the aforementioned electron transport material into a thin film by the commonly known method such as the vapor deposition method, spin coating method, casting method and printing method including the inkjet method, and LB method. There is no particular restriction to the thickness of the film of the electron transport layer. Normally this thickness is preferably about 5 nm through 5 μm, more preferably 5 through 200 nm. The electron transport layer can be designed to have a single layer structure made up of one or more than two of the aforementioned materials.

It is also possible to use an electron transport layer of high n-type doped with impurities. This is exemplified by the products disclosed in the Unexamined Japanese Patent Application Publications Nos. H4-297076, 2000-196140 and 2001-102175, as well as in J. Appl. Phys., 95, 5773 (2004).

The external take-up efficiency of the light emitted from the organic EL device of the present invention at a room temperature is preferably 1% or more, more preferably 5% or more, wherein:

> External take-up quantum efficiency (%)=number of the photons emitted to the organic EL device/the number of electrons flowing to the organic EL device×100.

It is also possible to use the hue improving filter such as a color filter, or use the color changing filter which uses a fluorophore to convert into multiple colors the color of light emitted from the organic EL device. When the color changing filter is used, the λmax of the light emitted from the organic EL device is preferably 480 nm or less.

(How to Manufacture the Organic EL Device)

The following describes the details of how to manufacture the organic EL device, with reference to the organic EL device having a structure of anode/positive hole injection layer/positive hole transport layer/light emitting layer/electron transport layer/electron injection leyer/cathode.

A desired electron substance, for example, a thin film made up of an anode substance is formed on the substrate (gas barrier film of the present invention) by vapor deposition, sputtering or plasma CVD method so that the film thickness will be 1 μm or less, preferably 10 through 200 nm, whereby an anode is produced. An organic compound thin film made of the positive hole injection layer, positive hole transport layer, light emitting layer, electron transport layer, electron injection layer and positive hole blocking layer is formed thereon as an organic EL device.

This organic compound thin film can be made thin by vapor deposition method or wet process (spin coating method, casting method, inkjet method and printing method), as described above. The vacuum vapor deposition method, spin coating method, inkjet method or printing method is used with particular preference because a homogeneous film can be provided easily and a pin hole does not occur easily. Further, a different film forming method can be used for each layer. When a vapor deposition method is used to form a film, the vapor deposition conditions differ according to the type of the compound to be used. Generally, the boat heating temperature is preferably 50 through 450° C., the degree of vacuum is preferably $10^{-6}$ through $10^{-2}$ Pa, vapor deposition speed is preferably 0.01 through 50 nm/sec., the substrate temperature is preferably −50 through 300° C., and the film thickness is preferably 0.1 nm through 5 μm, more preferably 5 through 200 nm.

After these layers have been formed, a thin film made up of a cathode substance is formed thereon to a thickness of 1 μm or less, more preferably 50 through 200 nm according to the vapor deposition or sputtering method, and a cathode is provided, whereby a desired organic EL device is obtained. This organic EL device is preferably manufactured in an integrated manner from the positive hole injection layer to the cathode in one evacuation operation. It can be taken out in the middle of the operation and a different film forming method can be applied. In this case, consideration must be given in such a way that the work is performed under the atmosphere of dry inert gas.

It is also possible to reverse the order of production in such a way that the cathode, electron injection layer, electron transport layer, light emitting layer, positive hole transport layer, positive hole injection layer and anode are manufactured in that order. When DC voltage is applied to the multi-color display apparatus obtained in this way, arrangements are made so that the anode is positive and the cathode is negative, and voltage of 2 through 40 volts is applied. Then light having been emitted can be observed. Further, AC voltage can also be applied. It should be noted that there is no restriction to the AC waveform to be applied.

The display apparatus using the organic EL device in the present invention can be used as an indication device, display, or various forms of light emitting source. If three types of organic EL devices—blue, red and green—are used on the indication device and display, a full-color display can be provided.

The indication device and display can be exemplified by a television set, personal computer, mobile equipment, AV equipment, text broadcast display, and on-car information display. In particular, they can be used as a display apparatus for reproducing a still image and motion image. When they are used as a display apparatus for reproducing a moving image, either a simple matrix (passive matrix) or an active matrix can be used as a drive method.

The illumination apparatus using the organic EL device of the present invention provides a light source for household illumination, on-car illumination, backlight for clocks and liquid crystals, advertisement, traffic signal, optical storage media, electrophotographic photocopiers, optical communications processing equipment and photo sensors, without being restricted thereto.

The organic EL device of the present invention can also be used as an organic EL device having a resonator structure. The organic EL device having a resonator structure provides a light source for optical storage media, electrophotographic photocopiers, optical communications processing equipment and photo sensors, without being restricted thereto. Laser oscillation can be used in the organic EL device of the present invention to serve the aforementioned application purposes.

[Display Apparatus]

The organic EL device of the present invention can also be used as one type of lamps for providing a light source for illumination or exposure. It can also be utilized as a projection apparatus of the image projection type, or a display apparatus for direct viewing of a still image or motion image. When it is used as a display apparatus for motion image reproduction, either a simple matrix (passive matrix) or an active matrix can be used as a drive method. A full-color display apparatus can be provided by employing three or more of the organic EL devices of the present invention capable of emitting different colors. Further, using a color filter, one luminescent color, for example, a white luminescent color can be converted into BGR colors, whereby a full color system can be produced. In this case, the λmax of the light emitted from the organic EL device is preferably 480 nm or less.

The following describes an example of the display apparatus made of the organic EL device of the present invention with reference to drawings.

Figure 8:
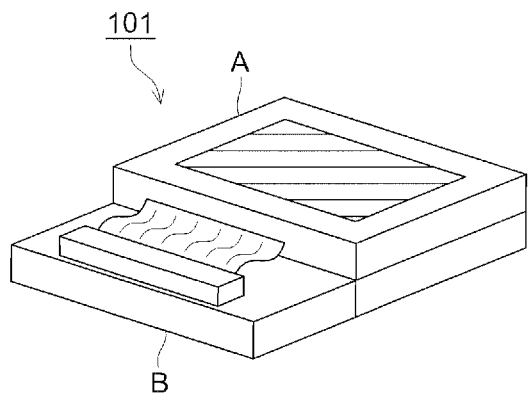
FIG. 8 is a schematic view showing an example of the display apparatus made up of an organic electroluminescent device.

FIG. 8 is a schematic diagram showing a display used in the mobile phone or the like wherein image information is displayed when light is emitted from the organic EL device.

The display 101 includes a display section A having a plurality of pixels and a control section B for performing image scanning of the display section A based on image information.

The control section B is electrically connected with the display section A, and a scanning signal and image data signal are sent to each of the pixels based on the external image information. In response to the image signal, pixels for each scanning line are illuminated sequentially by the scanning signal, and image scanning is performed, whereby image information is displayed on the display section A.

Figure 9:
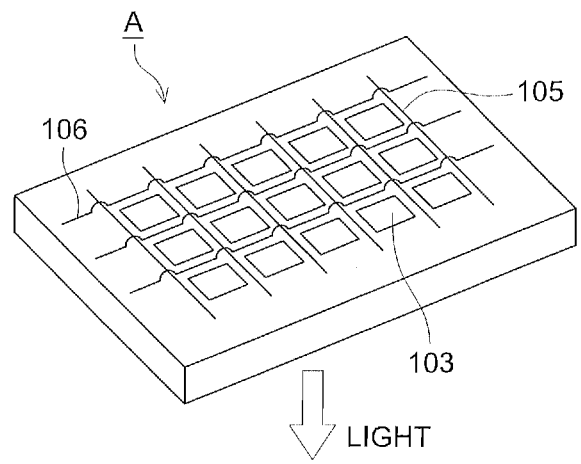
FIG. 9 is a schematic view showing the display section A.

FIG. 9 is a schematic diagram of the display section A.

The display section A includes a wiring section for a plurality of scanning lines 5 and data lines 106 and a plurality of pixels 103 arranged on the substrate. The following describes the major members of the display section A. In FIG. 9, the light emitted by the pixel 103 is led in the white-arrowed direction (downward).

The scanning lines 105 and data lines 106 of the wiring section are each made up of conductive materials, and the scanning line 105 and data lines 106 intersect at right angles, and are connected to the pixel 103 at the position of intersection (details not illustrated).

When a signal is applied from the scanning line 105, the pixel 103 receives the image data signal from the data line 106, and light is emitted in response to the image data having been received. The color of the emitted light ensures that the pixels in the red, green and blue areas are arranged on one and the same substrate as required, whereby a full color display is provided.

Figure 10:
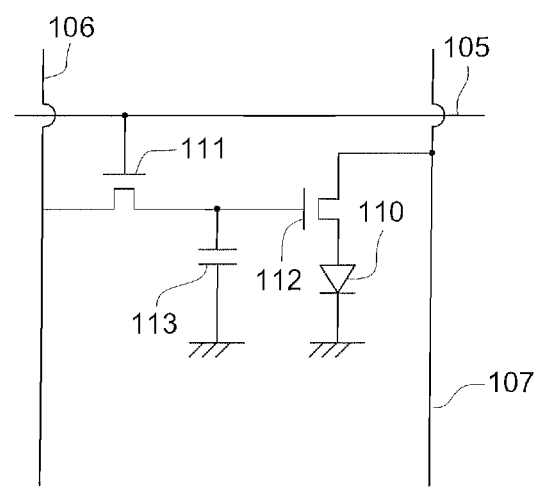
FIG. 10 is a schematic view showing a pixel.

The following describes the pixel light emitting process:

FIG. 10 is a schematic diagram representing a pixel.

The pixel is provided with the organic EL device 110, switching transistor 111, drive transistor 112 and capacitor 113. For a plurality of pixels, the organic EL devices for emitting beams of red, green and blue are used as the organic EL devices 110 are arranged on one and the same substrate as required, whereby a full color display is provided.

In FIG. 10, an image data signal is applied to the drain of the switching transistor 111 through the data line 106 from the control section B. When the scanning signal is applied to the gate of the switching transistor 111 through the scanning line 105 from the control section B, the drive of the switching transistor 111 is turned on and the image data signal applied to the drain is transmitted to the gates of the capacitor 113 and drive transistor 112.

The capacitor 113 is charged in response to the potential of the image data signal by the transmission of the image data signal, and the drive of the drive transistor 112 is turned on. The drain of the drive transistor 112 is connected to the power source line 107, and the source is linked to the electrode of the organic EL device 110. Current is supplied to the organic EL device 110 in response to the potential of the image data signal applied to the gate.

When the scanning signal has been sent to the scanning line 105 by the sequential scanning of the control section B, the drive of the switching transistor 111 is turned off. However, even if the drive of the switching transistor 111 is turned off, the capacitor 113 maintains the potential of the charged image data signal. Accordingly, the drive of the drive transistor 112 is kept turned on, and hence, the light emission of the organic EL device 110 is maintained until the next scanning signal is applied. When the next scanning signal has been applied by sequential scanning, the drive transistor 112 is driven in response to the potential of the next image data signal synchronized with the scanning signal, whereby the organic EL device 110 emits light.

To be more specific, for the organic EL device 110, the switching transistor 111 as an active device and the drive transistor 112 are provided on the organic EL devices 110 of each of the pixels, whereby light is emitted from the organic EL device 110 of each of a plurality of pixels 103. This is called an active matrix light emission method.

In this case, the light emitted from the organic EL device 110 can be either the light emitted in a plurality of gradations by the multilevel image data signal having a plurality of gradation potentials, or the light wherein emission of a predetermined amount of light is turned on or off by binary image data signal.

The potential of the capacitor 113 can be maintained until the next scanning signal is applied, or can be discharged immediately before the next scanning signal is applied.

In the present invention, the light emission drive system can be either the aforementioned active matrix system, or the passive matrix system wherein organic EL device emits light in response to the data signal only when the scanning signal has been scanned.

Figure 11:
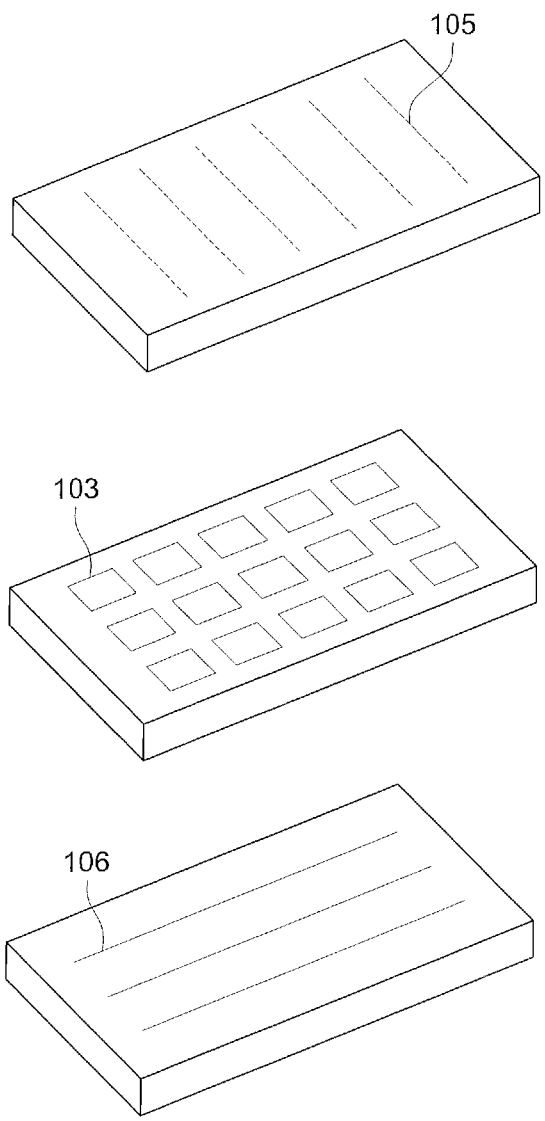
FIG. 11 is a schematic view showing a display apparatus of passive matrix structure.

FIG. 11 is a schematic diagram representing the display apparatus based on the passive matrix system. In FIG. 11, the scanning line 105 and data line 106 are arranged face to face with each other, with the pixel 103 sandwiched in-between.

When the scanning signal of the scanning line 105 is applied by the sequential scanning, the pixel 103 connected to the scanning line 105 to be applied emits light in response to the image data signal. In the passive matrix system, the pixel 103 has no active device, and reduction in the production cost can be achieved.

[Illumination Apparatus]

The organic EL device of the present invention as the illumination apparatus can be applied to the organic EL device wherein the virtually white light is emitted. A plurality of colors are emitted simultaneously by a plurality of light emitting materials, and a white light is emitted through color mixture. The combination of a plurality of emitted light colors may include three maximum emission wavelengths of three primary colors of blue, green and blue, or two maximum emission wavelengths using the relationship of complementary colors such as blue and yellow, and bluish green and orange colors.

The combination of the light emitting materials for getting a plurality of light colors can be either a combination of a plurality of the materials emitting a plurality of phosphorescent or fluorescent beams (light emitting dopant), or a combination of the light emitting material for emitting phosphorescent or fluorescent light, and the pigment material for emitting light using the light from the light emitting material as the excitation light. In the white organic EL device of the present invention, a combination of a plurality of light emitting dopants is preferably used.

The layer structure of the organic EL device for getting a plurality of light colors can be formed by the method of allowing a plurality of light emitting dopants to be present in one light emitting layer; the method wherein a plurality of light emitting layers are provided and the dopants having different light emitting wavelengths are present in each light emitting layer; and the method wherein the fine pixel for emitting light to the different waveforms is created on the shape of a matrix.

In the white organic EL device of the present invention, patterning can be performed according to the metal mask and inkjet printing method at the time of film formation as required. When patterning is to be performed, patterning can be applied to the electrode alone, to both the electrode and light emitting layer, or to the entire layer of the device.

There is no particular restriction to the light emitting material used in the light emitting layer. For example, in the case of a backlight in the liquid crystal device, the color can be converted into white by combination of the white complex of the present invention or any other desired one selected from the commonly known light emitting materials, so as to conform to the range of wavelength corresponding to the CF (color filter) characteristics.

As described above, in addition to the indication device and display, the white organic EL device can be used preferably as various types of light emitting light sources for household illumination, on-car illumination. It can also be employed as one of the lamps such as exposure light sources for the backlight of the liquid crystal display, and display apparatus.

Further, the white organic EL device can be used preferably as a light source for backlight for clocks, advertisement, traffic signal, optical storage media, electrophotographic photocopiers, optical communications processing equipment and optical sensors. It can also be used over an extensive range including the general household electric appliances requiring a display apparatus.

EXAMPLES

The following describes the present invention with reference to the example, without the present invention being restricted thereto.

Example 1

Plasma discharge processing was performed using the roll electrode type discharge processing apparatus shown in FIG. 4, and a ceramic film was formed on the substrate film. In the discharge processing apparatus, a plurality of rod-like electrodes were placed face to face with the roll electrode, parallel to the conveying direction of the film in such a way that the materials (discharge gas, reaction gas 1, 2 (to be described later)) can be supplied to each electrode.

The dielectric for coating each electrode, together with the opposing electrode, was coated on the ceramic sprayed electrode to a thickness of 1 mm on one side. After coating, the gap between the electrodes was set to 1 mm. Further, the base metal coating the dielectric was designed as a stainless steel jacket having a cooling function by coolant. Electrode temperature was controlled by coolant during the process of discharging. The light source used in this case was a high frequency power source manufactured by Applied Electrical Equipment (80 kHz), and a high frequency power source manufactured by Pearl Industries (13.56 MHz). Other conditions are as described below:

The substrate films were formed on the PEN film (150 μm thick) with acryl clear hard coated layer in the order of a closely bonded layer, a ceramic layer and a protective layer, as described below. The film thickness was 10 nm for the closely bonded layer, 50 nm for the ceramic layer and 50 nm for the protective layer. The temperature of the substrate film at the time of film formation was kept at 120° C.

Samples Nos. 1 through 5 as gas barrier films were produced under the following layer forming conditions while changing the power of the high frequency power source for formation of the ceramic layer.

In the following process, a closely bonded layer and a protective layer (film) were laminated in addition to the ceramic layer (film) of the present invention, wherein the generating conditions were changed.

<Ceramic Layer>
Discharge gas: $N_2$ gas
Reaction gas 1: 5% by volume of oxygen gas with respect to all the gases
Reaction gas 2: 0.1% by volume of tetraethoxy silane (TEOS) with respect to all the gases
Power of low frequency power source: 80 kHz at 10 W/cm$^2$
Power of high frequency power source: 13.56 kHz at 1 through 10 W/cm$^2$ The composition of this ceramic layer was $SiO_2$ for Samples Nos. 1 through 5. The density was 2.07 for Sample No. 1, 2.11 for Sample No. 2, 2.13 for Sample No. 3, 2.18 for Sample No. 4, and 2.20 for Sample No. 5.

<Closely Bonded Layer>
Discharge gas: $N_2$:
Reaction gas 1: 1% by volume of hydrogen gas with respect to all the gases
Reaction gas 2: 0.5% by volume of tetraethoxy silane (TEOS) with respect to all the gases
Power of low frequency power source: 80 kHz at 10 W/cm$^2$
Power of high frequency power source: 13.56 kHz at 10 W/cm$^2$ The composition of this closely bonded layer was $SiO_{1.48} \cdot C_{0.96}$, and the density was 2.02.

<Protect Layer>
Discharge gas: $N_2$:
Reaction gas 1: 1% by volume of hydrogen gas with respect to all the gases
Reaction gas 2: 0.5% by volume of tetraethoxy silane (TEOS) with respect to all the gases
Power of low frequency power source: 80 kHz at 10 W/cm$^2$
Power of high frequency power source: 13.56 kHz at 5 W/cm$^2$ The composition of this protective layer was $SiO_{1.48} C_{0.96}$, and the density was 2.03.

<How to Measure the Gas Barrier Performance>

The WOPET-003 of Creatic Inc. was used to measure the vapor barrier performance (permeability) of the ceramic film and oxygen barrier performance (permeability) of the ceramic film.

Up to the order of $10^{-2}$, the reference samples were compared and evaluated by the Model OX-TRAN2/21-L oxygen permeability measuring instrument and Model PERMATRAN-W3/33G vapor permeability measuring instrument of Mocon Inc. After that, calibration was made with reference to the instrument of Mocon Inc., and extrapolation was made by simulation up to the order of $10^{-7}$.

<Measuring the Density Ratio>

Baking was performed at 1100° C. using a silicon substrate as the film density ($\rho b$) of the bulk ceramic (silicon oxide: $SiO_2$), and a thermally oxidized film was formed on the surface to a thickness of 100 nm. The density of the thermally oxidized film was obtained by X-ray reflectivity measurement, and was found to be 2.20. This value was used as representing the density ($\rho b$) of the bulk silicon oxide film.

Further, while changing the electric power of the high frequency side power source, the density ($\rho f$) of the ceramic film (silicon oxide film) having been formed was calculated by the same X-ray reflectivity measurement for each sample with a ceramic film formed thereon.

In the measurement of the X-ray reflectivity, the Model MXP21 of MacScience Inc. was used as a measuring instrument, and copper was used as a X-ray source target. The instrument was operated at a voltage of 42 kV with a current of 500 mA. A multi-layer film parabola mirror was used on the incident monochrometer. The incident slit was 0.05 mm×5 mm, and the light receiving slit was 0.03 mm×20 mm. According to the 2θ/θ scanning process, measurement was conducted by the FT method in the range of 0 through 5° at a step width of 0.005°, 10 seconds per step. Curve fitting was applied to the reflectivity curve having been obtained, using the Reflectivity Analysis Program Ver. 1 of MacScience Inc., and parameters were obtained in such a way that the residual sum of squares between the actually measured value and fitting curve would be minimized. Then the density of each parameter was obtained from each parameter.

The density ratio was obtained for each of the samples from the density ($\rho f$) of the ceramic (silicon oxide) layer formed by the plasma CVD method under atmospheric pressure and the density ($\rho b$) of the ceramic (silicon oxide) layer.

TABLE 1

| Sample No. | High frequency power (W/cm$^2$) | Density ratio (=$\rho f/\rho b$) | Vapor barrier performance (g/m$^2$/day) | Remarks |
|---|---|---|---|---|
| 1 | 1 | 0.94 | 1.3 | Comparative example 1 |
| 2 | 3 | 0.96 | $8 \times 10^{-4}$ | Present invention |
| 3 | 5 | 0.97 | $3 \times 10^{-4}$ | Present invention |
| 4 | 7 | 0.99 | $6 \times 10^{-5}$ | Present invention |
| 5 | 10 | 1 | $2 \times 10^{-6}$ | Present invention |

TABLE 2

| Sample No. | High frequency power (W/cm²) | Density ratio (=ρf/ρb) | Oxygen barrier performance (g/m²/day) | Remarks |
|---|---|---|---|---|
| 1 | 1 | 0.94 | 2.5 | Comparative example 1 |
| 2 | 3 | 0.96 | $8 \times 10^{-2}$ | Present invention |
| 3 | 5 | 0.97 | $3 \times 10^{-2}$ | Present invention |
| 4 | 7 | 0.99 | $6 \times 10^{-3}$ | Present invention |
| 5 | 10 | 1 | $2 \times 10^{-4}$ | Present invention |

In Tables 1 and 2, the unit of the vapor permeability is g/m²/day, and that of oxygen permeability is ml/m²/day. The description in Tables 1 and 2 reveal that, if the density ratio is kept within the range of the present invention, both the vapor and oxygen barrier performances are high.

Example 2

A film having the following thickness was formed on the substrate according to the same procedure as that used in the Example 1, using the Model PD-270STP plasma CVD apparatus of Samco Inc.

The following describes the film forming conditions for each layer in Samples Nos. 6 through 10:

<Ceramic Layer>
Oxygen pressure: Gas pressure was changed at 13.3 through 133 Pa
Reaction gas: Tetraethoxy silane (TEOS), 5 sccm (standard cubic centimeter per minute)
Power: 100 W at 13.56 MHz
Retained substrate temperature: 120° C.
<Closely Bonded Layer and Protective Layer>

The power application was reversed under the aforementioned ceramic layer film making conditions, and the substrate holding side was used as the ground. Then high frequency power was applied to the side of the opposed electrode, whereby a film was formed. The composition of the protective layer and closely bonded layer of each sample was $SiO_{1.48}C_{0.96}$. The density of the protective layer and closely bonded layer was 2.08 for the sample No. 6, 2.05 for the sample No. 7, 2.02 for the sample No. 8, 1.98 for the sample No. 9 and 1.96 for the sample No. 10.

Similarly to the above case, a test was made to evaluate the density ratio (=ρf/ρb) of the ceramic layer of the gas barrier film having been formed with respect to the bulk film, and the residual stress. The gas barrier performance was also evaluated, similarly to the case of Example 1.

<Residual Stress Evaluation Procedure>
A barrier film was formed on a quartz glass having a thickness of 100 μm, a width of 10 mm and a length of 50 mm to a thickness of 1 μm. The residual stress was measured by the Model MH4000 thin film physical property evaluation apparatus of NEC-Sanei Inc. (MPa).

The gas barrier performance was measured twice to get the values in the initial stage and after the lapse of repeated thermo conditions. To be more specific, the sample was left to stand at 23° C. with a relative humidity of 55% RH for 24 hours and the temperature was changed from −40 to 85° C. 300 times in 30 minutes. After that, vapor and oxygen barrier performances were measured.

The following shows the result of the test. It should be noted that "—" in the column of gas pressure in Tables 3 and 4 indicates atmospheric pressure.

TABLE 3

| Sample No. | Gas pressure (Pa) | Density ratio (=ρf/ρb) | Stress | Vapor barrier performance (g/m²/day) Initial | Vapor barrier performance (g/m²/day) After repeated thermo conditions | Remarks |
|---|---|---|---|---|---|---|
| 6 | 26.6 | 0.97 | 100 MPa | $7 \times 10^{-3}$ | $2 \times 10^{-2}$ | Present invention |
| 7 | 39.9 | 0.97 | 80 MPa | $4 \times 10^{-3}$ | $4 \times 10^{-3}$ | Present invention |
| 8 | 53.2 | 0.97 | 50 MPa | $3 \times 10^{-3}$ | $3 \times 10^{-3}$ | Present invention |
| 5 | — | 1 | 0.9 MPa | $2 \times 10^{-6}$ | $3 \times 10^{-6}$ | Present invention |
| 9 | 60.0 | 0.97 | 15 MPa | $1 \times 10^{-3}$ | $5 \times 10^{-3}$ | Present invention |
| 10 | 63.8 | 0.97 | 5 MPa | $5 \times 10^{-4}$ | $4 \times 10^{-4}$ | Present invention |

TABLE 4

| Sample No. | Gas pressure (Pa) | Density ratio (=ρf/ρb) | Stress | Oxygen barrier performance (ml/m²/day) Initial | Oxygen barrier performance (ml/m²/day) After repeated thermo conditions | Remarks |
|---|---|---|---|---|---|---|
| 6 | 26.6 | 0.97 | 100 MPa | $4 \times 10^{-2}$ | $9 \times 10^{-2}$ | Present invention |
| 7 | 39.9 | 0.97 | 80 MPa | $3 \times 10^{-2}$ | $3 \times 10^{-2}$ | Present invention |
| 8 | 53.2 | 0.97 | 50 MPa | $6 \times 10^{-3}$ | $6 \times 10^{-3}$ | Present invention |
| 5 | — | 1 | 0.9 MPa | $2 \times 10^{-4}$ | $2 \times 10^{-4}$ | Present invention |
| 9 | 60.0 | 0.97 | 15 MPa | $3 \times 10^{-3}$ | $5 \times 10^{-3}$ | Present invention |
| 10 | 63.8 | 0.97 | 5 MPa | $3 \times 10^{-4}$ | $4 \times 10^{-4}$ | Present invention |

Example 3

<Formation of Transparent Conductive Film>
A transparent conductive film was formed on the ceramic film of the sample No. 5 of the gas barrier film produced in the Example 1 by the following method.

A plasma discharging apparatus having parallel flat electrodes was utilized, and the aforementioned transparent film was mounted between these electrodes. Then a gas mixture was introduced to form a thin film.

In the ground electrode, the stainless steel plate measuring 200 mm×200 mm×2 mm was coated with a closely bonded alumina sprayed film. After that, the solution formed by diluting the tetramethoxy silane with ethyl acetate was coated and dried. Then it was cured by ultraviolet rays, and was provided with pore sealing treatment. Then the dielectric surface coated in this manner was polished and smoothed, and the electrode was process so that the Rmax value would be 5 μm. The applied electrode used was arranged in such a way that the hollow rectangular pure titanium pipe was coated with the dielectric under the same conditions as those of the ground electrode. A plurality of applied electrodes were manufactured and were arranged face to face with the ground electrode, thereby creating a discharging space.

The Model JRF-10000 high frequency power source of Nippon Denshi Inc. was used as the power source used for plasma generation. The power of 5 W/cm² at a frequency of 13.56 MHz was supplied.

The gas mixture of the following composition was fed between electrodes to create a state of plasma. The aforementioned gas barrier film was subjected to plasma processing under atmospheric pressure, and the tin doped indium oxide (ITO) was formed on the gas barrier layer (ceramic film) to a thickness of 100 nm.

Discharge gas: 98.5% by volume of helium

Reaction gas 1: 0.25% by volume of oxygen

Reaction gas 2: 1.2% by volume of indium acetyl acetonate

Reaction gas 3: 0.05% by volume of dibutyl tin diacetate (Production of Organic EL Device)

The gas barrier film (100 mm×100 mm) with the aforementioned ITO film formed thereon was used as a substrate. After having been subjected to patterning, the gas barrier film provided with the ITO transparent electrode was ultrasonically cleaned by isopropyl alcohol, and was dried by dry nitrogen gas. This transparent support substrate was fixed on the substrate holder of a vacuum vapor deposition apparatus available on the market. In the meantime, 200 mg of α-NPD was put into a molybdenum-made resistance heating boat, and 200 mg of CBP as a host compound was put in another molybdenum-made resistance heating boat. Further, 200 mg of bathocuproin (BCP) was put in still another molybdenum-made resistance heating boat, 100 mg of Ir-1 was put in a further molybdenum-made resistance heating boat, and 200 mg of Alq$_3$ was put in a still further molybdenum-made resistance heating boat. This was mounted on the vacuum vapor deposition apparatus.

Then the pressure of the vacuum tank was reduced down to 4×10⁻⁴ Pa and an electrical current was applied to the aforementioned heating boat filled with α-NPD so that the mixture was heated. The mixture was vapor-deposited on the transparent support substrate at a vapor deposition speed of 0.1 nm per second and a positive hole transport layer was formed. Further, an electrical current was applied to the aforementioned heating boats filled with CBP and Ir-1 so that the mixture was heated. The mixtures were vapor-deposited on the aforementioned positive hole transport layer, and were each at a vapor deposition speeds of 0.2 nm and 0.012 nm per second and a positive hole transport layer was formed. Thus, a light emitting layer was formed. The substrate temperature was equal to the room temperature at the time of vapor deposition. Further, an electrical current was applied to the aforementioned heating boat filled with BCP so that the mixture was heated. The mixture was vapor-deposited on the light emitting layer at a vapor deposition speed of 0.1 nm per second and a positive hole blocking layer was formed to a thickness of 10 nm. Further, an electrical current was applied to the aforementioned heating boat filled with Alq$_3$ so that the mixture was heated. The mixture was vapor-deposited on the aforementioned positive hole blocking layer at a vapor deposition speed of 0.1 nm per second and a positive hole transport layer was formed to a thickness of 10 nm. The substrate temperature was equal to the room temperature at the time of vapor deposition.

This was followed by the step of vapor deposition of 0.5 nm of lithium fluoride and 110 nm of aluminum, whereby a cathode was formed and an organic EL device was produced.

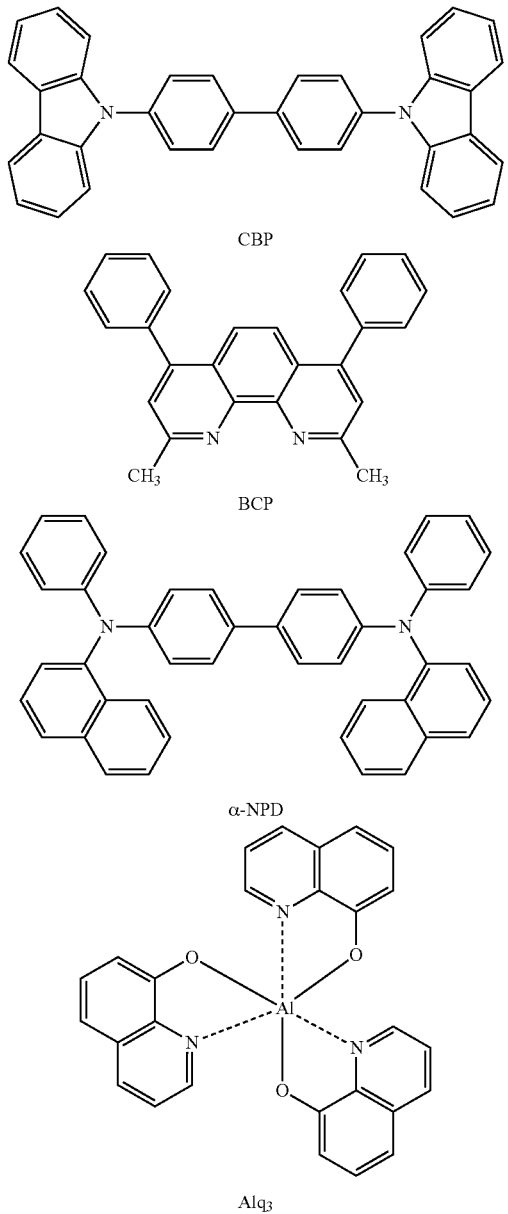

[Chemical Formula 6]

CBP

BCP

α-NPD

Alq$_3$ (Production of Sealing Film 1)

Polypropylene was laminated to a thickness of 30 μm on one side of the aluminum foil having a thickness of 30 μm. The other side of this foil was subjected to discharge processing, using a roll electrode type discharge processing apparatus used in Example 1 and shown in FIG. 4. Then the same a ceramic (SiO$_2$) film as that of the Example 1 was formed to a thickness of 30 nm under the following conditions, whereby a sealing film was produced.

<Ceramic Layer>

Discharge gas: N$_2$ gas

Reaction gas 1: 5% by volume of oxygen gas with respect to all the gases

Reaction gas 2: 0.1% by volume of tetraethoxy silane (TEOS) with respect to all the gases Power of low frequency power source: 80 kHz at 10 W/cm²
Power of high frequency power source: 13.56 kHz at 10 W/cm²

Under the environment wherein air was purged by nitrogen gas (inert gas), the SiO₂ side of the sealing film 1 and the cathode side of the organic EL device were bonded using an epoxy based adhesive, also, the SiO₂ side of the sealing film 1 and the surrounding area of the gas barrier film where the organic EL device was not provided thereon were bonded using the epoxy based adhesive, whereby the device was sealed, and an organic EL device 1 was produced.

(Production of Sealing Film 2)

Polypropylene was laminated to a thickness of 30 μm on one side of the aluminum foil having a thickness of 30 μm, whereby a sealing film 2 was produced.

Under the environment wherein air was purged by nitrogen gas (inert gas), the side of the sealing film 2 not provided with polypropylene film (metallic surface of the aluminum foil) was bonded to the cathode surface of the organic EL device, and to the surrounding area without the organic EL device of gas barrier film being formed thereon, using an epoxy based adhesive, whereby an organic EL device 2 was produced.

(Evaluation of Organic EL Device),

An electrical current was applied to the organic EL device having been produced, under the conditions of high temperature and high humidity registering 60° C. with a relative humidity of 95% RH, and the presence or absence of a dark spot was checked.

The examination has revealed that both organic EL devices 1 and 2 were satisfactory, and the organic EL devices produced by the sealing method of the present invention exhibited excellent sealing performances with dark spots hardly occurring. In particular, the rate of occurrence of dark spots was smaller in the organic EL device 1 wherein a ceramic film was formed on the aluminum foil, and this surface was bonded with the cathode by sealing.

What is claimed is:

1. A gas barrier film comprising a resin substrate provided thereon at least one layer of a ceramic film,
    wherein the density ratio Y (=ρf/ρb) satisfies 1≧Y>0.95 and the ceramic film has a residual stress being a compression stress of 0.01 MPa or more and 80 MPa or less,
    wherein ρf is the density of the ceramic film and ρb is the density of a comparative ceramic film being formed by thermal oxidation or thermal nitridation of a metal as a mother material of the ceramic film so as to being the same composition ratio of the ceramic film.

2. The gas barrier film of claim 1,
    wherein the density ratio Y (=ρf/ρb) satisfies 1≧Y>0.98.

3. The gas barrier film of claim 1,
    wherein the residual stress is 0.01 MPa or more and 10 MPa or less.

4. The gas barrier film of claim 1,
    wherein a material constituting the ceramic film is a silicon oxide, a silicon oxide-nitride, a silicon nitride, an aluminum, oxide, or a mixture thereof.

5. A resin substrate for an organic electroluminescent element comprising the gas barrier film of claim 1 provided thereon a transparent conductive thin film.

6. An organic electroluminescent element being formed by providing a resin substrate of claim 5,
    coating a phosphorescence emitting organic electroluminescent material layer and a metal layer as a cathode on the resin substrate and,
    sealing with adhesion of a metal foil laminated on a resin layer.

7. The organic electroluminescent element of claim 6, wherein the metal foil laminated on the resin layer comprises the metal foil, the resin layer at the other side of a metal cathode against the metal foil and a ceramic layer at the side of the metal cathode against the metal foil.

8. The as barrier film of claim 1,
    wherein an anchor coating agent layer is provided between the resin substrate and the ceramic film, the coating amount of the anchor coating agent in the anchor coating agent layer being 0.1 to 5 g/m² in a dried state.

9. The gas barrier film of claim 8,
    wherein the anchor coating agent layer is made of at least one of the group consisting of a polyester resin, an isocyanate resin, a urethane resin, an acrylic resin, an ethylene vinyl alcohol resin, a vinyl denatured resin, an epoxy resin, a denatured styrene resin, a denatured silicon resin, and an alkyl titanate.

10. A gas barrier film comprising a resin substrate provided thereon at least one layer of a ceramic film,
    wherein the density ratio Y (=ρf/ρb) satisfies 1≧Y>0.95 and the ceramic film has a residual stress being a compression stress of 0.01 MPa or more and 100 MPa or less,
    wherein ρf is the density of the ceramic film and ρb is the density of a comparative ceramic film being formed by thermal oxidation or thermal nitridation of a metal as a mother material of the ceramic film so as to being the same composition ratio of the ceramic film, and
    wherein the gas barrier film is manufactured by exciting a gas containing a thin film forming gas between a first and second electrode by applying a first power source producing a high frequency electric field in the range of 3 kHz to 400 kHz with a power density in the range of 5 to 50 W/cm² to the first electrode and a second power source producing a high frequency electric field in the range of 800 kHz to 150 MHz with a power density in the range of 1 to 50 W/cm² to the second electrode under atmospheric pressure or a pressure close to the atmospheric pressure, provided that the gas contains a nitrogen gas in an amount of 50% by volume or more; and
    exposing a resin substrate to the excited gas so as to form the at least one layer of a ceramic film on the resin substrate.

* * * * *